US008386227B2

(12) United States Patent
Fung et al.

(10) Patent No.: US 8,386,227 B2
(45) Date of Patent: Feb. 26, 2013

(54) MACHINE, COMPUTER PROGRAM PRODUCT AND METHOD TO GENERATE UNSTRUCTURED GRIDS AND CARRY OUT PARALLEL RESERVOIR SIMULATION

(75) Inventors: Larry S. K. Fung, Dhahran (SA); Mokhles M. Mezghani, Dhahran (SA)

(73) Assignee: Saudi Arabian Oil Company (SA)

( * ) Notice: Subject to any disclaimer, the term of this patent is extended or adjusted under 35 U.S.C. 154(b) by 195 days.

(21) Appl. No.: 12/876,727

(22) Filed: Sep. 7, 2010

(65) Prior Publication Data

US 2012/0059639 A1 Mar. 8, 2012

(51) Int. Cl.
*G06G 7/48* (2006.01)

(52) U.S. Cl. .......................................................... 703/10
(58) Field of Classification Search .................. 703/9, 10
See application file for complete search history.

(56) References Cited

U.S. PATENT DOCUMENTS

| | | | |
|---|---|---|---|
| 5,321,612 A | 6/1994 | Stewart | |
| 5,710,726 A | 1/1998 | Rowney | |
| 5,729,451 A | 3/1998 | Gibbs | |
| 5,740,342 A | 4/1998 | Kocberber | |
| 6,078,869 A | 6/2000 | Gunasekera | |
| 6,106,561 A * | 8/2000 | Farmer | 703/10 |
| 6,128,577 A | 10/2000 | Assa | |
| 6,278,948 B1 | 8/2001 | Jorgensen | |
| 6,282,452 B1 | 8/2001 | Deguzman | |
| 6,424,918 B1 | 7/2002 | Jorgensen | |
| 6,430,507 B1 | 8/2002 | Jorgensen | |
| 6,502,037 B1 | 12/2002 | Jorgensen | |
| 6,675,097 B2 | 1/2004 | Routh | |
| 6,810,370 B1 | 10/2004 | Watts | |
| 6,823,297 B2 | 11/2004 | Jenny et al. | |
| 6,826,520 B1 | 11/2004 | Khan et al. | |
| 6,907,392 B2 | 6/2005 | Bennis | |
| 6,928,399 B1 | 8/2005 | Watts et al. | |
| 6,980,940 B1 | 12/2005 | Gurpinar | |
| 6,993,433 B2 | 1/2006 | Chavarria | |
| 7,006,959 B1 | 2/2006 | Huh et al. | |
| 7,047,165 B2 | 5/2006 | Balaven | |
| 7,177,764 B2 | 2/2007 | Stone | |

(Continued)

FOREIGN PATENT DOCUMENTS

| EP | 0881357 | 10/2004 |
|---|---|---|
| EP | 1869579 | 1/2007 |

(Continued)

OTHER PUBLICATIONS

Fung et al., "Distributed Unstructured Grid Infrastructure for Complex reservoir Simulation", SPE 113906 (2008), pp. 1-9.

(Continued)

*Primary Examiner* — David Silver
(74) *Attorney, Agent, or Firm* — Bracewell & Giuliani LLP

(57) ABSTRACT

A machine, computer program product, and method to enable scalable parallel reservoir simulations for a variety of simulation model sizes are described herein. Some embodiments of the disclosed invention include a machine, methods, and implemented software for performing parallel processing of a grid defining a reservoir or oil/gas field using a plurality of sub-domains for the reservoir simulation, a parallel process of re-ordering a local cell index for each of the plurality of cells using characteristics of the cell and location within the at least one sub-domain and a parallel process of simulating at least one production characteristic of the reservoir.

20 Claims, 19 Drawing Sheets

U.S. PATENT DOCUMENTS

| | | | |
|---|---|---|---|
| 7,225,324 B2 | 5/2007 | Huppenthal | |
| 7,277,836 B2 | 10/2007 | Netemeyer | |
| 7,379,853 B2 | 5/2008 | Middya | |
| 7,496,488 B2 | 2/2009 | Jenny et al. | |
| 7,526,418 B2 | 4/2009 | Pita et al. | |
| 7,546,229 B2 * | 6/2009 | Jenny et al. | 703/10 |
| 7,627,461 B2 | 12/2009 | Guyaguler | |
| 8,095,349 B2 * | 1/2012 | Kelkar et al. | 703/10 |
| 2002/0049575 A1 | 4/2002 | Jalali et al. | |
| 2002/0177986 A1 | 11/2002 | Moeckel | |
| 2003/0201098 A1 | 10/2003 | Karanikas | |
| 2006/0085174 A1 | 4/2006 | Hemanthkumar | |
| 2006/0235667 A1 | 10/2006 | Fung | |
| 2006/0277013 A1 | 12/2006 | Bennis | |
| 2006/0282243 A1 | 12/2006 | Childs et al. | |
| 2007/0073527 A1 | 3/2007 | Flandrin | |
| 2010/0217574 A1 * | 8/2010 | Usadi et al. | 703/10 |

FOREIGN PATENT DOCUMENTS

| | | |
|---|---|---|
| WO | 2006020952 A2 | 2/2006 |
| WO | WO2009075945 | 6/2009 |
| WO | 2011100002 A1 | 8/2011 |

OTHER PUBLICATIONS

Dogru et al., "A Next-Generation Parallel Reservoir Simulator for Giant Reservoirs", SPE 119272 (2009), pp. 1-29.

PCT International Search report and Written Opinion (PCT/US2011/049290), dated May 16, 2012.

Schoof, L.A. and Victor R. Yarberry, "Exodus II A Finite Element Data Model", SAND92-2137, Sandia National Laboratories, 1995.

VTK format, www.vtk.org.

ABAQUS format, www.abaqus.com.

Goldthorpe, W.H., Chow, Y.S., "Unconventional Modeling of Faulted Reservoirs: A Case Study", SPE 13526, Feb. 10-13, 1985, Dallas, Texas.

Kydland, T., Haugan, P.M., Bousquet, G., Havig, S.O., "Application of Unconventional Techniques in Constructing an Integrated Reservoir Simulation Model for Troll Field", SPEJ, Aug. 1988.

Aurenhammer, Franz, "Voronoi Diagrams—A Survey of a Fundamental Geometric Data Structure", ACM Computing Surveys, Sep. 1991, vol. 23 No. 3.

Vinsome, P.K.W. "Orthomin, an Iterative Method for Solving Spare Sets of Simultaneous Linear Equations", SPE 5729, 1976, pp. 149-159, SPE.

Saad, Y., et al. "GMRES: A Generalized Minimal Residual Algorithm for Solving Nonsymmetric Linear Systems", SIAM J. Sci. Stat. Comput., Jul. 1986, pp. 856-869, vol. 7, No. 3.

Holmes, J.A., "Enhancements to the Strongly Coupled, Fully Implicit Well Model: Wellbore Crossflow Modeling and Collective Well Control" SPE 12259 the 7th Reservoir Simulation Symposium, Nov. 1983, pp. 255-266.

Wallis, J.R. et al., "Constrained Residual Acceleration of Conjugate Residual Methods", SPE 13536, the 8th Reservoir Simulation Symposium, Feb. 1985, pp. 415-428.

Al-Shallan, T.M., et al., "Modeling of Faults and Pinchouts in Parallel Environment", SPE SA 43, May 2004, pp. 1-8, Saudi Arabian Section.

Fung, L.S.K., et al., "Hy-brid-CVFE Method for Flexible-Grid Reservoir Simulation", SPE Reservoir Engineering, Aug. 1994, pp. 188-194.

Fung, L.S.K., et al., "Simulation of Block-to-Block Processes in Naturally Fractured Reservoirs", SPE Reservoir Engineering, Nov. 1991, pp. 477-484.

Dogru, A.H., et al., "A Massively Parallel Reservoir Simulator for Large Scale Reservoir Simulation", SPE 51886, 1999 SPE Reservoir Simulation Symposium, Houston, Texas, Feb. 1999, pp. 1-28.

Dogru, A.H., et al., "Simulation of Super K Behavior in Ghawar by a Multi-Million Cell Parallel Simulator", SPE 68066, Middle East Oil Show, Bahrain, Mar. 17-20, 2001, pp. 1-10.

Fung, L.S.K., et al., "Reservoir Simulation With a Control-Volume Finite-Element Method", SPE Reservoir Engineering, Aug. 1992, pp. 349-357.

Stackel, A.W., et al., "An Example Approach to Predictive Well Management in Reservoir Simulation", Journal of Petroleum Technology, Jun. 1981, pp. 311-318.

Wijesinghe, A.M., et al., "A Comprehensive Well Management Program for Black Oil Reservoir Simulation", SPE 12260, SPE Symposium on Reservoir Simulation, San Francisco, California, Nov. 1983, pp. 267-284.

Wallace, D.J., et al., "A Reservoir Simulation Model with Platform Production/Injnection Constraints for Development Planning of Volatile Oil Reservoirs", SPE 12261, Reservoir Simulation Symposium, San Francisco, California, Nov. 1983, pp. 285-296.

Mohammed, D.A., et al., "An Efficient Reservoir-Coupled Gas Gathering System Simulator", SPE 8333, SPE Annual Technical Conference and Exhibit, Las Vegas, Nevada, Sep. 23-26, 1979, pp. 1-10.

Mrosovsky, I., et al., "Construction of a Large Field Simulator on a Vector Computer", Journal of Petroleum Technology, Dec. 1980, pp. 2253-2264.

Podio, A.L., et al., "Total Well Management Aids Production of Beam Pumped Wells", Petroleum Engineer International, Oct. 1995, pp. 27, 29, 31-32, vol. 68, No. 10, Hart Publication, US.

Yao, Kaifeng, et al., "Hydrocarbon Reservoir Prediction Using Support Vector Machines", Adv. in Neural Networks, Intnl Sym. on Neural Networks Prec., Aug. 2004, pp. 537-542, vol. 1, Springer-Verlag Berlin, Germany.

Yeten, Burak, et al., "Optimization of Nonconventional Well Type, Location and Trajectory", SPE 77565, SPE Annual Technical Conference and Exhibition, San Antonio, Texas, Sep. 29-Oct. 2, 2002, pp. 1-14.

Abate, Jason, et. al., "Parallel Compositional Reservoir Simulation on a Cluster of PCs", The International Journal of High Performance Computering Applications, Dec. 21, 1998, pp. 1-10.

Wu, Yu-Shu, et al., "An Efficient Parallel-Computing Method for Modeling Nonisothermal Multiphase Flow and Multicomponent Transport in Porous and Fractured Media", Advances in Water Resources, Mar. 2002, pp. 243-261, vol. 25 Issue 3, Elsevier Science Ltd.

Litvak, M.L., "New Procedure for the Phase-Equilibrium Computations in the Compositional Reservoir Simulator" SPE 25252, SPE Advanced Technology Series, 1994, pp. 113-121, vol. 2, No. 2.

Dogru, A.H., et al., "A Parallel Reservoir Simulator for Large Scale Reservoir Simulation", SPE Advanced Technology Series, Feb. 2002, pp. 11-23.

Dogru, A.H., et al., "Megacell Reservoir Simulation", SPE Advanced Technology Series, May 2000, pp. 54-60, vol. 52, No. 5.

Coats, Keith H., "An Equation of State Compotitional Model", Society of Petroleum Engineers Journal, Oct. 1980, pp. 363-376.

Coats, Keith H., "Compositional and Black Oil Reservoir Simulation", SPE 29111, SPE Symposium on Reservoir Simulation, San Antonio, Texas Feb. 12-15, 1995, pp. 149-162.

Wang, P., et al., "A Fully Implicit Parallel EOS Compositional Simulator for Large Scale Reservoir Simulation", SPE 51885, SPE Reservoir Simulation Symposium, Houston, Texas, Feb. 14-17, 1999, pp. 1-9.

Wang, P., et al., "Proper Use of Equations of State for Compositional Reservoir Simulation", SPE 69071, Jul. 2001, pp. 74-80.

Helman, C., "What does a company making $250 billion a year do for an encore?" Forbes, http://www.forbes.com/forbes/2008/1124/044_print.ntml, Nov. 24, 2008.

"Saudi Aramco Completes First Giga-Cell Reservoir Simulation Run" http://www.rigzone.com/news/article.asp?a, Saudi Aramco, Nov. 26, 2008.

Aziz, Khalid, et al., "Petroleum Reservoir Simulation", 1979, pp. 125-199, 303-349, 357-375, Applied Science Publishers LTD, London.

Ertekin, Turgay, et al., "Basic Applied Reservoir Simulation" 2001, pp. 1-10, 105-178, 218-367, 391-394, Society of Petroleum Engineers Inc., Richardson, Texas.

* cited by examiner

| CELL ID | CONNECTED GLOBAL CELL IDS | CELL ID | CONNECTED GLOBAL CELL IDS |
|---|---|---|---|
| 1 | 56 55 57 66 | 27 | 186 141 185 187 214 |
| 2 | 57 56 58 67 | 28 | 187 142 186 73 215 |
| 3 | 58 57 59 68 | 29 | 210 182 209 211 226 |
| 4 | 59 58 60 69 | 30 | 211 183 210 212 227 |
| 5 | 60 59 70 | 31 | 212 184 211 213 228 |
| 6 | 66 56 65 67 136 137 138 | 32 | 213 185 212 214 229 |
| 7 | 67 57 66 68 138 139 140 | 33 | 214 186 213 215 230 |
| 8 | 68 58 67 69 140 141 142 | 34 | 215 187 214 73 231 77 |
| 9 | 69 59 68 70 142 73 | 35 | 226 210 225 227 239 |
| 10 | 70 60 69 74 | 36 | 227 211 226 228 240 |
| 11 | 73 69 74 142 187 215 77 | 37 | 228 212 227 229 241 |
| 12 | 74 70 73 78 | 38 | 229 213 228 230 242 |
| 13 | 77 73 215 231 244 78 81 | 39 | 230 214 229 231 243 |
| 14 | 78 74 77 82 | 40 | 231 215 230 77 244 |
| 15 | 81 77 244 257 270 82 85 | 41 | 239 226 238 240 252 |
| 16 | 82 78 81 86 | 42 | 240 227 239 241 253 |
| 17 | 137 66 136 138 182 | 43 | 241 228 240 242 254 |
| 18 | 138 66 67 137 139 183 | 44 | 242 229 241 243 255 |
| 19 | 139 67 138 140 184 | 45 | 243 230 242 244 256 |
| 20 | 140 67 68 139 141 185 | 46 | 244 231 243 77 257 81 |
| 21 | 141 68 140 142 186 | 47 | 252 239 251 253 265 |
| 22 | 142 68 69 141 187 73 | 48 | 253 240 252 254 266 |
| 23 | 182 137 181 183 210 | 49 | 254 241 253 255 267 |
| 24 | 183 138 182 184 211 | 50 | 255 242 254 256 268 |
| 25 | 184 139 183 185 212 | 51 | 256 243 255 270 269 |
| 26 | 185 140 184 186 213 | 52 | 257 244 256 81 270 |

FIG. 11

| PROC. ID | NO. OF ADJ. PROCS. | ADJACENT PROC. IDS | | | | |
|---|---|---|---|---|---|---|
| 0 | 2 | 1 | 7 | | | |
| 1 | 5 | 2 | 6 | 0 | 3 | 7 |
| 2 | 2 | 1 | 3 | | | |
| 3 | 2 | 2 | 1 | | | |
| 4 | 2 | 5 | 7 | | | |
| 5 | 2 | 7 | 4 | | | |
| 6 | 2 | 1 | 7 | | | |
| 7 | 5 | 6 | 5 | 0 | 1 | 4 |

FIG. 12

| REQUIRED DATA EXCHANGE INFO. | SUB-DOMAIN 6 LOCAL CELL IDS | | | | | | | |
|---|---|---|---|---|---|---|---|---|
| Cell IDs of data to be sent to Proc. 1 | 38 | 39 | 40 | 41 | 42 | 43 | 44 | 45 |
| Cell IDs of data to be sent to Proc. 7 | 45 | 46 | 47 | 48 | 49 | 50 | 51 | 52 |
| Cell IDs of data to be received from Proc. 1 | 53 | 54 | 55 | 56 | 57 | 58 | 59 | 60 |
| Cell IDs of data to be received from Proc. 7 | 61 | 62 | 63 | 64 | 65 | 66 | 67 | 68 |

FIG. 13

| CELL ID | CONNECTED LOCAL CELL IDS | CELL ID | CONNECTED LOCAL CELL IDS | |
|---|---|---|---|---|
| 1 | 38 14 2 | 27 | 15 28 | |
| 2 | 1 39 13 33 3 12 | 28 | 27 16 29 | |
| 3 | 2 33 12 4 | 29 | 28 32 30 | |
| 4 | 3 34 11 5 | 30 | 29 31 52 | |
| 5 | 4 35 10 6 | 31 | 32 19 20 21 51 30 | |
| 6 | 5 36 9 7 | 32 | 16 17 18 19 31 29 | |
| 7 | 6 37 8 47 | 33 | 39 2 40 3 34 | |
| 8 | 9 7 22 48 | 34 | 33 41 4 35 | |
| 9 | 10 6 23 8 | 35 | 34 42 5 36 | |
| 10 | 11 5 24 9 | 36 | 35 43 6 37 | |
| 11 | 12 4 25 10 | 37 | 36 44 7 46 | |
| 12 | 13 2 3 26 11 | 38 | 39 1 | 53 |
| 13 | 14 2 16 12 26 17 | 39 | 38 40 33 2 | 54 55 |
| 14 | 1 15 13 | 40 | 39 33 41 | 55 |
| 15 | 14 27 16 | 41 | 40 34 42 | 56 |
| 16 | 15 13 28 17 32 | 42 | 41 35 43 | 57 |
| 17 | 13 16 26 18 32 | 43 | 42 36 44 | 58 |
| 18 | 17 25 32 19 | 44 | 43 37 45 | 59 |
| 19 | 18 24 32 20 31 | 45 | 44 46 | 60 61 |
| 20 | 19 23 31 21 | 46 | 37 45 47 | 62 |
| 21 | 20 22 31 50 51 | 47 | 7 46 48 | 63 |
| 22 | 23 8 21 49 | 48 | 8 47 49 | 64 |
| 23 | 24 9 20 22 | 49 | 22 48 50 65 | 65 |
| 24 | 25 10 19 23 | 50 | 21 49 51 | 66 |
| 25 | 26 11 18 24 | 51 | 31 21 50 52 | 66 67 |
| 26 | 13 12 17 25 | 52 | 30 51 | 68 |

FIG. 16

| LOCAL CELL ID | 21 | 22 | 23 | 24 | 25 | 26 | 27 | 28 | 29 | 30 |
|---|---|---|---|---|---|---|---|---|---|---|
| GLOBAL CELL ID | 244 | 243 | 230 | 214 | 186 | 141 | 60 | 70 | 74 | 78 |

| LOCAL CELL ID | 11 | 12 | 13 | 14 | 15 | 16 | 17 | 18 | 19 | 20 |
|---|---|---|---|---|---|---|---|---|---|---|
| GLOBAL CELL ID | 185 | 140 | 68 | 58 | 59 | 69 | 142 | 187 | 215 | 231 |

| LOCAL CELL ID | 21 | 22 | 23 | 24 | 25 | 26 | 27 | 28 | 29 | 30 |
|---|---|---|---|---|---|---|---|---|---|---|
| GLOBAL CELL ID | 244 | 243 | 230 | 214 | 186 | 141 | 60 | 70 | 74 | 78 |

| LOCAL CELL ID | 31 | 32 | 33 | 34 | 35 | 36 | 37 | 38 | 39 | 40 |
|---|---|---|---|---|---|---|---|---|---|---|
| GLOBAL CELL ID | 77 | 73 | 138 | 183 | 211 | 227 | 240 | 56 | 66 | 137 |

| LOCAL CELL ID | 41 | 42 | 43 | 44 | 45 | 46 | 47 | 48 | 49 | 50 |
|---|---|---|---|---|---|---|---|---|---|---|
| GLOBAL CELL ID | 182 | 210 | 226 | 239 | 252 | 253 | 254 | 255 | 256 | 257 |

| LOCAL CELL ID | 51 | 52 | 53 | 54 | 55 | 56 | 57 | 58 | 59 | 60 |
|---|---|---|---|---|---|---|---|---|---|---|
| GLOBAL CELL ID | 81 | 82 | 55 | 65 | 136 | 181 | 209 | 225 | 238 | 251 |

| LOCAL CELL ID | 61 | 62 | 63 | 64 | 65 | 66 | 67 | 68 |
|---|---|---|---|---|---|---|---|---|
| GLOBAL CELL ID | 265 | 266 | 267 | 268 | 269 | 270 | 85 | 86 |

FIG. 17

MACHINE, COMPUTER PROGRAM PRODUCT AND METHOD TO GENERATE UNSTRUCTURED GRIDS AND CARRY OUT PARALLEL RESERVOIR SIMULATION

BACKGROUND OF THE INVENTION

1. Field of the Invention

The present invention relates to oil and gas reservoir simulation and more particularly related to a machine, computer program product, and method to enable scalable parallel processing of oil and gas reservoirs for a variety of simulation model sizes.

2. Description of Prior Art

A subterranean geologic body or formation contains multiphase, multi-component fluids, and accordingly a petroleum reservoir may contain oil, natural gas, water and several constituent compounds, that may be modeled to predict the fluid flow from a reservoir, which is also known as reservoir simulation. Reservoir simulation models may be run before or after a well is drilled to determine production rate, etc. for the various methods.

Current reservoir modeling techniques create a numerical grid of the reservoir comprised of a plurality of grid cells, and process data in the finite volume of each grid cell. Because reservoirs can be very large and complex, and grid cells can number in the millions to over one billion, the simulation models can take several hours to days to run. The desirable runtime is in the minutes to a few hours maximum as hundreds of runs are usually required for history matching. Accordingly, Saudi Aramco's POWERS™ program was created to speed up data processing using parallel computing. Parallel computing, as performed by the POWERS™ program, divides the numerical grid into a plurality of domains, with each domain consisting of a plurality of grid cells. The numerical grid is a structured grid, meaning each grid cell can be described the same, i.e., each inner vertex is incident to a fixed number of cells and each cell is defined by a fixed number of faces and edges. Structured grids may use Cartesian coordinate (I, J, K), or some other similar mapping method to locate grid cells for data processing. To run the simulations, rock properties, described using geologic models (porosity, permeability, etc.) as well as the geometry of the rock formation and data related to the well bore, are read into each computer. Because the domain is sub-divided into several finite volumes, or grid cells, conservation equations of mass, momentum, and energy are then constructed for each grid cell. These balance equations represent the discrete time rate of change of these quantities stored in the grid block due to the inter-block fluxes and sources and sinks of the quantities due to the physical and chemical processes being modeled, and are accordingly a set of discrete non-linear partial differential equations involving complex functions. Finally, using the mapping method for the grid, each computer can arrange for cross talk with other computers to simulate flow through the domains. FIG. 1 shows a prior art, two-dimensional structured grid of a reservoir with a multi-lateral well disposed therein. As can be seen, each grid cell is uniform, regardless of the geological feature or proximity of the grid cell to the well.

Unfortunately, reservoirs are of a sedimentary origin and have multiple layers that have thicknesses and depth variations throughout, which do not neatly follow the pattern of a structured grid. For example, a layer can disappear locally due to lack of deposition or subsequent erosion, which is known as a pinch-out. Also, uplifting (the raising of the earth's crust) and subsidence (the lowering of the earth's crust) over geologic time can lead to faulting and fracturing of the layers. In addition to the complexity of the reservoir layers, complex wells may be drilled into the reservoirs to extracts fluids from them or to inject fluids into them for pressure maintenance or enhance-oil-recovery operations, i.e., these wells may be multi-branched. Simply a structured grid does not produce accurate flow models in these circumstances. Better, unstructured grids, built to represent the geologic layers and well would represent faults, fractures, pinchouts and well geometry, are required for accuracy.

To create unstructured grids, oil or gas reservoirs are sub-divided into non-uniform elementary finite-volumes, i.e., grid cells or grid blocks. These grid cells can have variable numbers of faces and edges that are positioned to honor physical boundaries of geological structures and well geometry embedded within the reservoir. Accordingly, these maps may be very complex. Examples of unstructured gridding methods includes Voronoi diagrams, i.e., a grid where each cell has faces and edges that are closer to one Voronoi site or point than any other Voronoi site or point. FIG. 2 is an example of a two dimensional Voronoi grid. While unstructured grids more accurately reflect the geological features of the geological body, in order to perform unstructured grid simulation using parallel processing techniques, the global coordinate system, e.g., (I,J,K) Cartesian indexing, must be replaced with a global hash table, accessible by the computer processing each domain, to arrange for cell and domain cross-talk. Unfortunately, the global hash table for a model with, e.g., tens of millions to over a billion cells, can overwhelm the memory of for each of the parallel computers.

In addition to the problems with prior art reservoir grids, simulating reservoirs having multi-lateral wells require more data input and use more complex algorithms, and simulation models for this types of production methods can be very cumbersome—even using the POWERS™ system. The computational complexity of these equations is further complicated by geological model size is typically in the tens of millions to hundreds of millions of grid cells. Since finding a solution to several million to a few billion nonlinear partial differential equations with multiphase discontinuities is computationally expensive, reservoir simulation models are usually built at a coarser scale than the geologic model via a process known as upscaling, i.e., the averaging of rock properties for a plurality of grid cells. While computationally more efficient, upscaling renders the simulation model inaccurate. It is very desirable to develop simulation system that can directly use the original geologic model without upscaling and can honor complex well geometries and geology at the same time.

Therefore, the machine, methods, and program products in this invention constitute the enabling technology to do scalable parallel reservoir simulation of a desired model sizes (from small models to over one-billion-cell models) using both unstructured grids for complex reservoirs and multi-lateral wells, and structured grids at seismic-scale geologic model without upscaling.

SUMMARY OF THE INVENTION

In view of the foregoing, various embodiments of the present invention advantageously provide a machine, program product, and method for facilitating parallel reservoir simulation for a plurality of grid types and simulation types, and which does not require the use of a global hash table to local grid cells for communication between computing nodes of a supercomputer, described herein as application servers.

More specifically, a machine defining a plurality of application servers with a plurality of executable codes running on each application server that simulates at least one production characteristic for a plurality of oil or gas wells defined by a grid of a reservoir, the grid comprised of a plurality of cells with boundaries that are defined by geologic characteristics, complex well geometries, and user-specified cell sizes of the reservoir is described herein. The application server has a processor and a memory, the memory having computer readable instructions stored thereon and operable on the processor, Each software code executing on each application server collectively causing the application server to perform a process of dividing the grid, whose cells has been indexed previously and stored consecutively on computer disk, into a plurality of sub-domains, each containing optimally nearly an equal number of cells for processing based on the user specified number of application servers to be used, and a process of assigning each application server ownership of a sub-domain among the plurality of sub-domains; the computer readable instructions comprising: creating the plurality of cells from geologic characteristics and well geometries of the subsurface, the plurality of cells having faces that are foamed equidistant to each of a plurality of points corresponding to the geologic characteristics and well geometries, discounting any grid cells that are not active, and dividing the remaining cells into a plurality of sub-domains, and assigning each one of the cells an original index; and at least one separate application server having a processor and a memory with computer readable instructions stored thereon, the at least one application server being assigned at least one sub-domain and including a computer program product, operable on the memory, for performing a process of re-ordering a local cell identification reference for each of the plurality of cells using characteristics of the cell and location within the at least one sub-domain and a process of simulating at least one production characteristic of the reservoir; the computer readable instructions comprising: creating an initial local cell identification reference for each of the plurality of cells in the sub-domain, each local cell identification reference being mapped to original index for each of the plurality of cells, generating transmissibility characteristics between each of the plurality of cells in the sub-domain using grid data, well data and permeability data read into the memory of the separate application server using the initial local cell identification reference, determining at least one other sub-domain adjacent to the sub-domain, and which of the plurality of grid cells share at least one face with grid cells of the at least one other sub-domain, re-indexing each of the plurality of grid cells according to whether the grid cell shares at least one face with grid cells of the at least one other sub-domain, re-indexing each of the plurality of grid cells according to the transmissibility of each of the plurality of grid cells, and transmitting simulation data between the application servers for the grid cells sharing at least one face with the at least one other sub-domain adjacent to the sub-domain with the one other sub-domain.

A computer program product according to an exemplary embodiment of the invention is also described. The exemplary computer program product is operable on a cluster of machines wherein each machine defining a computer and stored in a memory of the computer, the computer program product performing a collective process of dividing a grid defining a reservoir into a plurality of sub-domains and a plurality of cells, a process of re-ordering a local cell identification reference for each of the plurality of cells using characteristics of the cell and location within the at least one sub-domain and a process of simulating at least one production characteristic of the reservoir; the computer program product performing the steps of: creating the plurality of cells from geologic characteristics and well geometries of the subsurface, the plurality of cells having faces that are formed equidistant to each of a plurality of points corresponding to the geologic characteristics and well geometries; discounting any grid cells that are not active, and dividing the remaining cells into a plurality of sub-domains; assigning each one of the cells an original index; creating an initial local cell identification reference for each of the plurality of cells in the sub-domain, each local cell identification reference being mapped to original index for each of the plurality of cells; generating transmissibility characteristics between each of the plurality of cells in the sub-domain using grid data, well data and permeability data read into the memory of the separate application server using the initial local cell identification reference; determining at least one other sub-domain adjacent to the sub-domain, and which of the plurality of grid cells share at least one face with grid cells of the at least one other sub-domain; re-indexing each of the plurality of grid cells according to whether the grid cell shares at least one face with grid cells of the at least one other sub-domain; re-indexing each of the plurality of grid cells according to the transmissibility of each of the plurality of grid cells; and transmitting simulation data between the grid cells sharing at least one face with the at least one other sub-domain adjacent to the sub-domain with the one other sub-domain.

A computer-implemented method for performing a process of dividing a grid defining a reservoir into a plurality of sub-domains for processing, a process of re-ordering a local cell identification reference for each of the plurality of cells using characteristics of the cell and location within the at least one sub-domain and a process of simulating at least one production characteristic of the reservoir according to an exemplary embodiment of the invention is also described. The computer-implemented method performing the steps of: creating the plurality of cells from geologic characteristics and well geometries of the subsurface, the plurality of cells having faces that are formed equidistant to each of a plurality of points corresponding to the geologic characteristics and well geometries; discounting any grid cells that are not active, and dividing the remaining cells into a plurality of sub-domains; assigning each one of the cells an original index; creating an initial local cell identification reference for each of the plurality of cells in the sub-domain, each local cell identification reference being mapped to original index for each of the plurality of cells; generating transmissibility characteristics between each of the plurality of cells in the sub-domain using grid data, well data and permeability data read into the memory of the separate application server using the initial local cell identification reference; determining at least one other sub-domain adjacent to the sub-domain, and which of the plurality of grid cells share at least one face with grid cells of the at least one other sub-domain; re-indexing each of the plurality of grid cells according to whether the grid cell shares at least one face with grid cells of the at least one other sub-domain; re-indexing each of the plurality of grid cells according to the transmissibility of each of the plurality of grid cells; and transmitting simulation data between the grid cells sharing at least one face with the at least one other sub-domain adjacent to the sub-domain with the one other sub-domain.

Accordingly, as will be described herein below, embodiments of the machine, computer program product and methods allow for scalable parallel reservoir simulations using complex geological, well and production characteristics and over one-billion grid cells.

BRIEF DESCRIPTION OF THE DRAWINGS

So that the manner in which the features and advantages of the invention, as well as others, which will become apparent, may be understood in more detail, a more particular description of the invention briefly summarized above may be had by reference to the embodiments thereof, which are illustrated in the appended drawings, which form a part of this specification. It is to be noted, however, that the drawings illustrate only various embodiments of the invention and are therefore not to be considered limiting of the invention's scope as it may include other effective embodiments as well.

FIG. 11 is a chart showing the local graph for a sub-domain showing a relationship of the local cell identification numbers for cells in the outer region of a sub-domain to the global cell identification numbers of cells connected to the cells in the outer region of the sub-domain according to an embodiment of the invention;

FIG. 12 is a chart showing connectivity between sub-domains according to an embodiment of the invention;

FIG. 13 is a chart showing the connectivity of cells within sub-domains according to an embodiment of the instant invention;

FIG. 16 is a chart showing the connectivity of local cell IDs based on the final permutation excluding self connections according to an embodiment of the invention; and FIG. 17 is a map of local cell IDs to global cell IDs for a sub-domain according to an embodiment of the invention.

DETAILED DESCRIPTION

The present invention will now be described more fully hereinafter with reference to the accompanying drawings in which embodiments of the invention are shown. This invention may, however, be embodied in many different forms and should not be construed as limited to the illustrated embodiments set forth herein; rather, these embodiments are provided so that this disclosure will be thorough and complete, and will fully convey the scope of the invention to those skilled in the art. Like numbers refer to like elements throughout.

Figure 1:
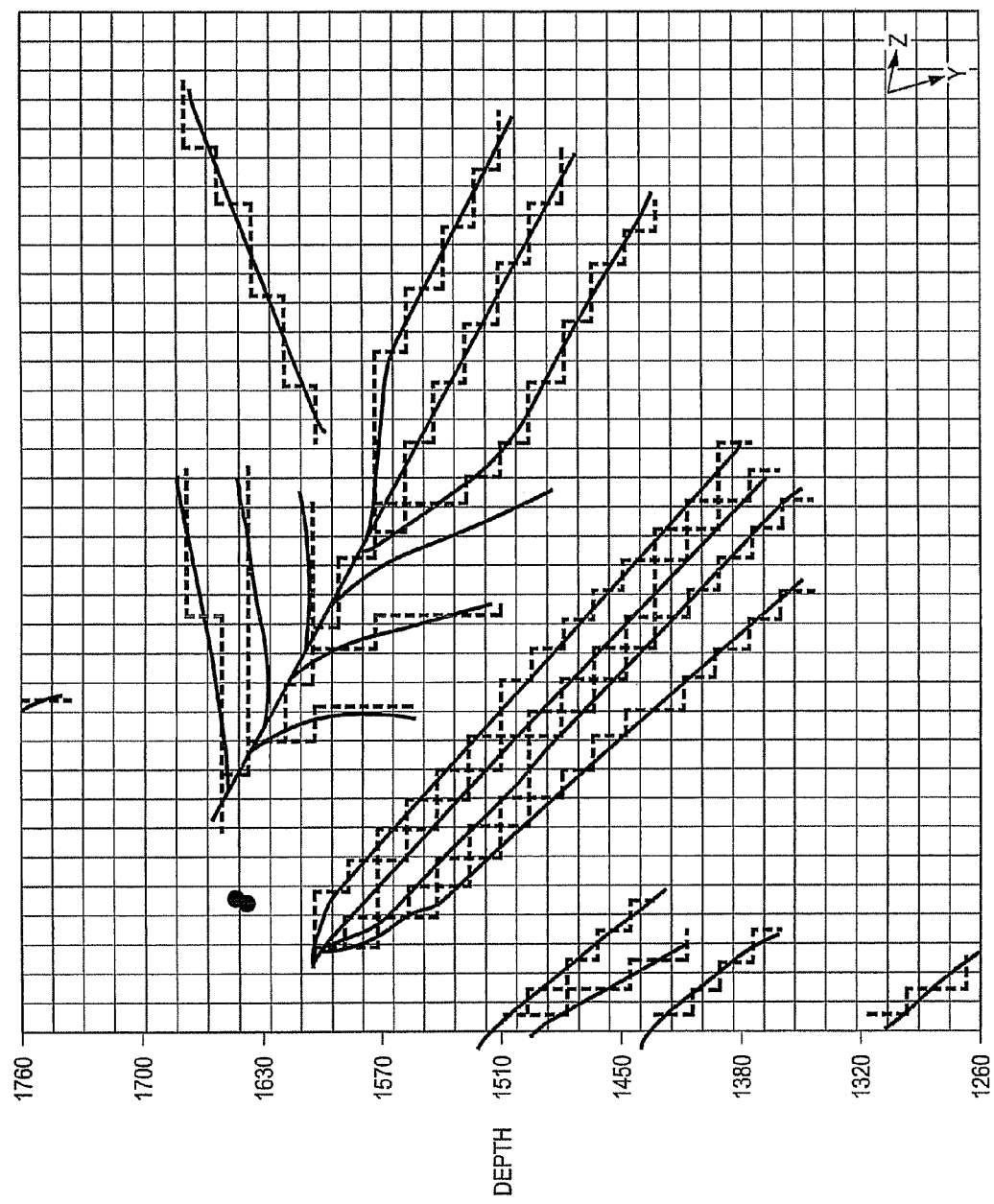
FIG. 1 is a diagram of approximated well geometries of a multi-lateral well in a structured grid where the grid is not optimized to the production characteristics according to the prior art.
Figure 2:
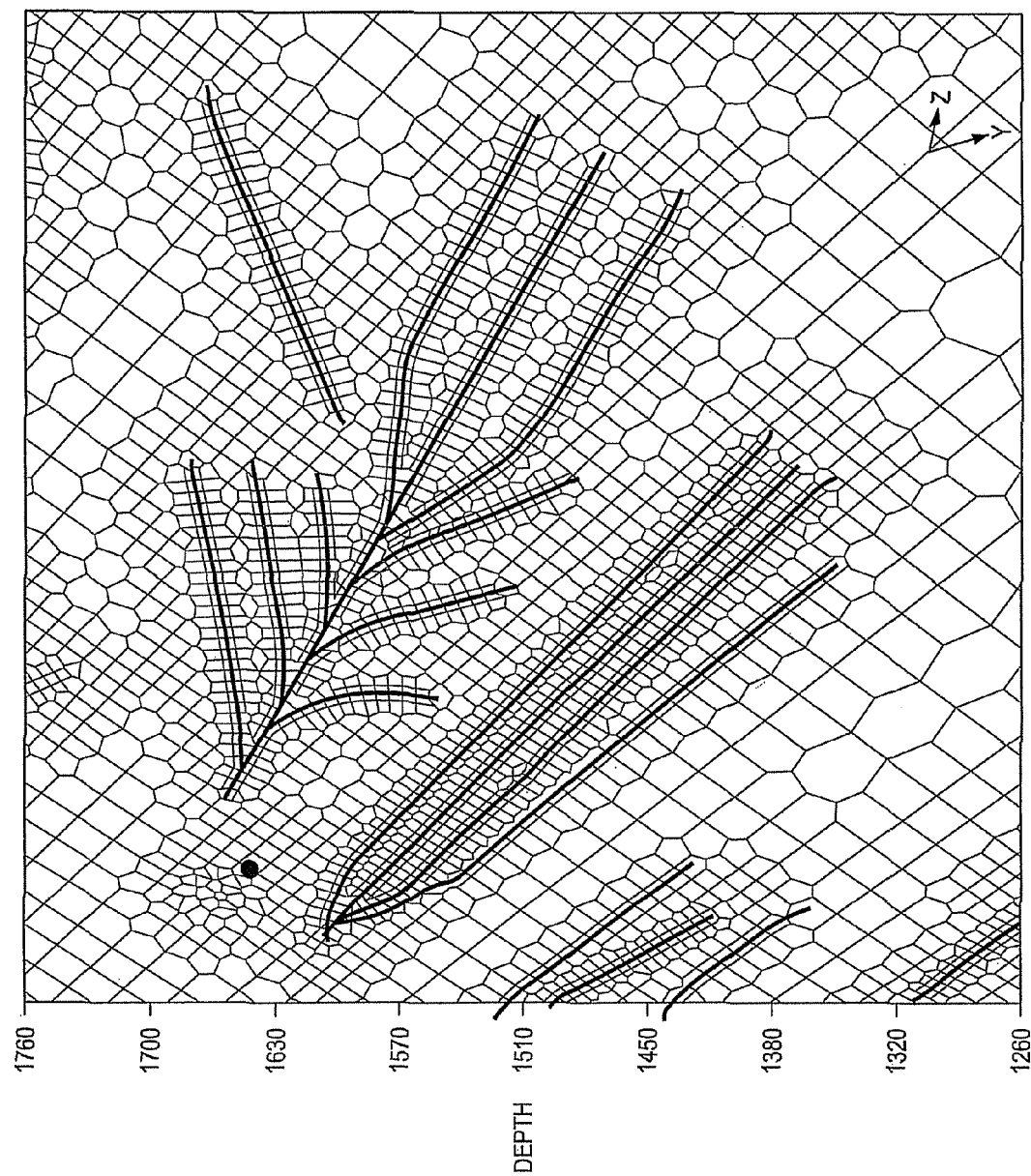
FIG. 2 approximated well geometries of a multi-lateral in an unstructured grid where the grid is optimized to the production characteristics according to the present invention.
Figure 3A:
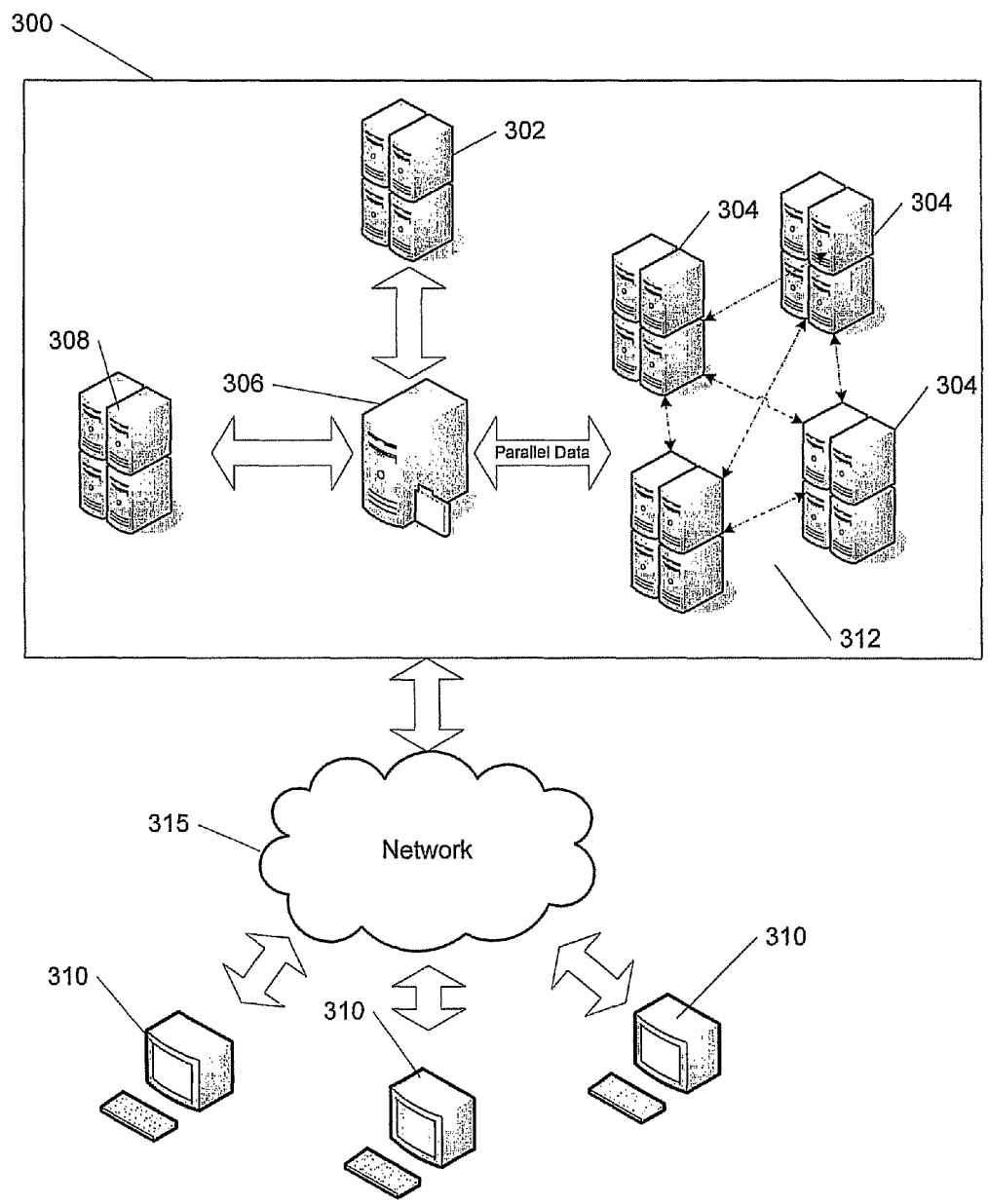
FIG. 3A is a diagram of a distributed network for processing the simulation using parallel computing according to an embodiment of the invention.
Figure 3B:
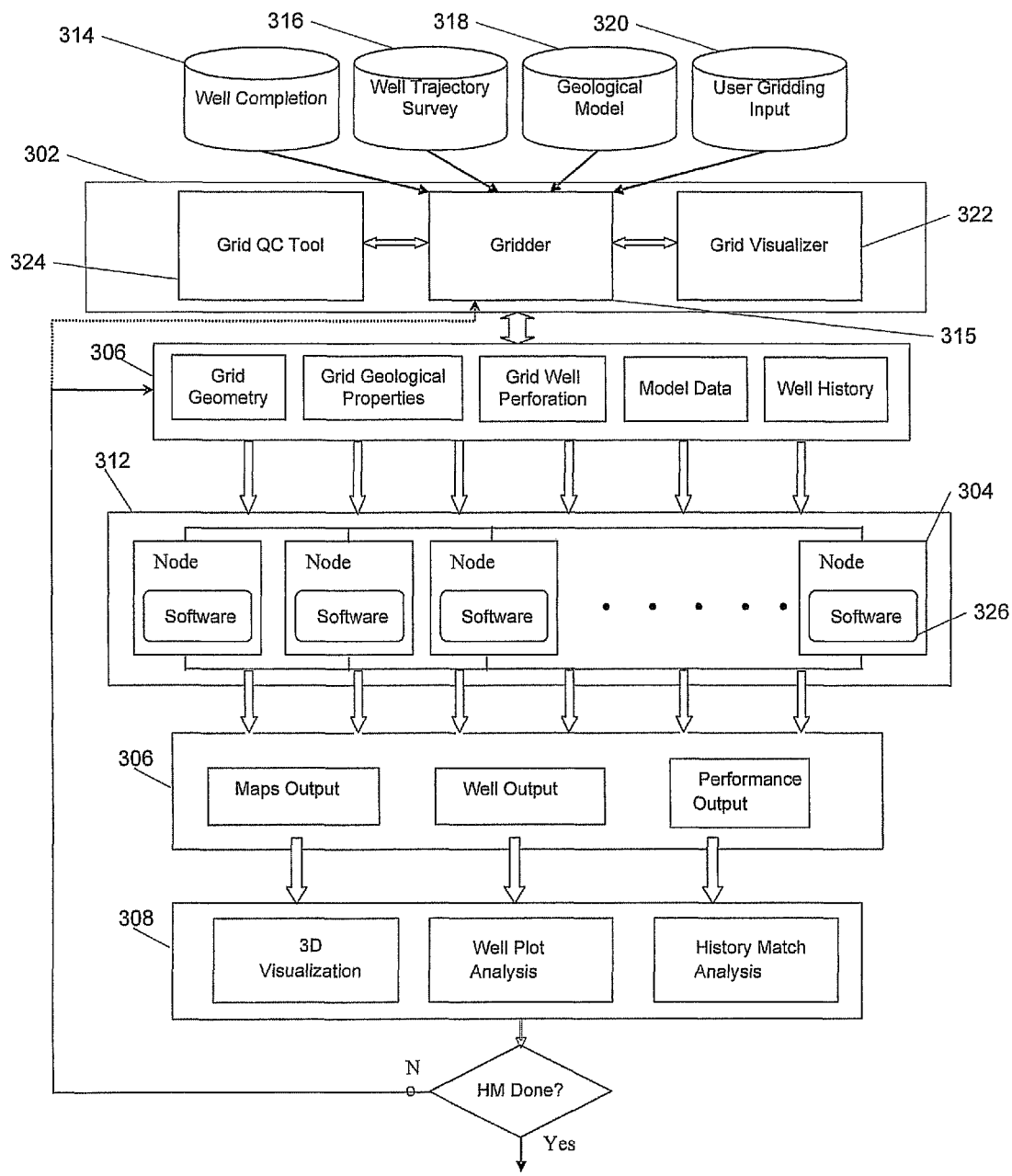
FIG. 3B is a data and work flow diagram for the parallel processing of unstructured/structured reservoir simulation according to an embodiment of the invention

FIGS. 3A and 3B describe an exemplary networked group of computers defining an embodiment of the machine of the instant invention. However, as one skilled in the art will recognize, the inventive machines, program products, and methods of the invention can be implemented on a wide variety of computer hardware from a single PC workstation to a massively parallel high performance supercomputer illustrated in FIGS. 3B and 4B, involving several thousands of processing cores on thousands of compute nodes. As such, though these embodiments are not specifically described herein, they are included within the scope of this disclosure. An exemplary inventive machine is described in detail with reference to FIGS. 3A and 3B. The exemplary machine consists of a pre-processing server 302 for generating and managing the reservoir grids and directing grid data into storage; a plurality of application servers 304 for receiving grid, well-production and completion data and processing reservoir simulations; file server 306 for the management and storage of simulation data, reservoir grids, geological data, well-production data, and well completion data in files or databases in the memory; post-processing server 308 for processing completed simulation data, workstations 310 for viewing simulations and well performance data generated by application servers 304 and computer network 316 for connecting the pre-processing server 302, application servers 304, file server 306 and post-processing server 308 to workstations 310.

As shown, at least one file server 306 may be employed by the machine to manage well production and completion data, grid data, and simulation data and to allow the pre-processing server 302, post processing server 308 and plurality of application servers 304 to upload data to and download data from the file server 306. The file server 306 may include databases such as well completion database 314, well trajectory survey database 316, geological model database 318, and user gridding input database 320, each providing data to pre-processing server 302; databases or files storing grid geometry, grid geological properties, grid well perforation, model data, well history generated by pre-processing server 302 and input into the application servers 304; databases or files storing output maps, well output, and performance calculations generated by application server 304 and input into the post-processing server 308; and databases or files storing 3D visualization data, well plot analyses, and history match analyses output from post-processing server 308. File server 306 may be network attached storage (NAS), storage area networks (SAN), or direct access storage (DAS), or any combination thereof, comprising, e.g., multiple hard disk drives. File server 306 may also allow various user workstations 310 to access and display data stored thereon. Accordingly, as is known in the art, file server 308 may have stored thereon database management system, e.g. a set of software programs that controls the organization, storage, management, and retrieval of data in the databases, such as 314/316/318/320 as is know in the art.

Databases 314/316/318/320, and any other databases or files stored in file server 306, may be separate databases as shown, or the same database, and well completion data, e.g., well production, completion and injection data; geological data e.g., fluid dynamics, rock porosity, etc; and simulation data, e.g., completed or partially complete grids or simulations, can be stored in a plurality of databases, tables, or fields in separate portions of the file server memory. As one skilled in the art will appreciate, file server 306 provides the pre-processing server 302, each of the application servers 304, and the workstations 310 access to the databases through, e.g., database management software or other application. Moreover, a database server may be used to store the databases instead of or in addition to file server 306, and such a configuration is within the scope of this disclosure. In some configurations, file server 306 may be configured so that the organization of data files that store simulation data and the output snap-shots of dynamic simulation results are independent of the number application servers 304 used to run a simulation model. As such, the inventive method may generate an indexing system to do parallel scattered I/O where each application server 304 reads data and write results for its portion of the simulation to the exact positions, i.e., data files, in the file server. In such an embodiment, regardless of the number of application servers used, the data and results stored in data files are always the same. In some applications, the well and reservoir data may be stored in databases, but all or a portion of grid data output from gridder 315 can be stored in an indexed files and are organized in global cell indexing which is invariant of the number of application servers 304 used to run the model, e.g., compressed sparse row (CSR) format.

As is known in the art, CSR format stores data which indicates the spatial connectivities of grid cells in the model. Therefore, in such embodiments, some databases and file represented in FIG. 3B could use CSR format for the datasets. In this regard, dataset array parameters may be defined using CSR protocols. Datasets created by gridder 315 are stored in file server 306 can be defined by a dataset type, a data rank, dataset dimensions, and units, which can then be read by the application servers 304 to perform the simulation. Together, the file server 306 can store enough datasets to define, completely and uniquely, the reservoir geometry utilizing a 3D unstructured grid of the instant invention.

Returning to FIG. 3A, workstations 310 are connected to the machine 300 using, e.g., communication network 315. Workstations 310 may be any personal computer (PC) as is known in the art and may run UNIX, Linux, Windows®, or some other operating system compatible with the networked systems discussed herein. Moreover, workstations 310 may access computer program products stored on pre and post processing servers to input simulation or processing parameters. For example, simulation engineers positioned at workstations 310 could manually select fluid parameters, production characteristics, i.e., run a simulation with various well types such as multi-lateral wells with different numbers and sizes of laterals, reservoir or simulation size, rock features, etc., through software applications stored or accessible on the workstations. Data entered from the workstations can be stored on the file server 306 memory, pre-processing server 302 memory, or post-processing server 308 memory for access during the reservoir simulation. Reservoir engineers may also access simulation data, partial or complete, simulation characteristics, run time, processor speed, compute processes run, etc., on application servers 304 as may be needed to monitor the simulation. As one skilled in the art will appreciate, it is possible for workstations 310 to interface with a separate web or network server for access to the simulation through the communications network, and such a configuration may be preferred.

Communications network 315 connects the workstations 310, the machine 300, and various networked components together. As one skilled in the art will appreciate, the computer network 315 can connect all of the system components using a local area network ("LAN") or wide area network ("WAN"), or a combination thereof. For example, pre-processing server 302, file server 306, application servers 304, and post-processing server 308 may be privately networked to allow for faster communication and better data synchronization between computing nodes, or pre-processing server 302, application servers 304, file server 306, and post-processing server 308, may be networked using a LAN, with a web server (not shown) interfacing with the workstations 310 using a WAN. Accordingly, though not all such configurations are depicted, all are within the scope of the disclosure.

At least one pre-processing server 302 and application servers 304, for example, perform the functions of the inventive method of the invention, and are used to perform reservoir simulations. In addition, pre-processing server 302, although represented as one server, may be a plurality of servers, e.g., may be configured as separate application servers and a web server, creates the unstructured 3 dimensional reservoir grid and assigns the distributed computers a portion of the grid for processing, as will be discussed herein below. Application servers 304 perform the simulation processing functions for each of the grid cells loaded into the server for processing. As one skilled in the art will appreciate, though depicted as application servers, each of the application servers 304 may be workstations that can be used by individual reservoir engineers to access data. One skilled in the art will appreciate, however, that parallel processing techniques described herein are by way of example, and the methods and gridding software of the instant invention can be used in serial processing environments. Importantly, as is known in grid computing, each application server performs a distributed read of the well history and grid data for processing. As one skilled in the art will appreciate, each application server accessing the file server 302 only reads data regarding one process node.

As shown in FIG. 3A, the file server 306 is connected to a network of applications servers 304. The applications servers 304 are depicted separately networked on TCP/IP network that allows for rapid communication between the compute nodes-though depending upon the cluster architecture, both the application servers 304 and pre-processing server 302 may be separately networked. For example, the application servers 304 may be configured as a grid cluster, with each application server having separate software loaded thereon on reading compute data from the file server 306 to perform data processing. Alternatively, as one skilled in the art will recognize, the application servers 304 may be configured as a compute cluster, or Beowulf cluster, where the pre-processing server 302 or similar server distributes files to the application server 304 using communication libraries that allow for data exchange. As one skilled in the art will also recognize there are several different methodologies for deploying distributed computing systems and all of these are within the scope of this disclosure. Moreover, the system architecture may support a variety of operating systems and communications software for each of the pre-processing server 302 and application servers 304. For example, Unix, Linux, Microsoft Compute Cluster, etc., are examples of operating systems that may be used to form a super computer like the one contemplated herein, and Message Passing Interface (MPI interfacing) or Parallel Virtual Machine (PVM) software libraries may be used to provide communication between the servers herein, which is discussed in detail herein below.

An exemplary pre-processing server 302 will now be described. The pre-processing server may access the file server e.g., data from well completion database 314, well trajectory survey database 316, geological model database 318, and user gridding input database 320. The pre-processing server 302 may perform preliminary calculations and grid generation using unstructured grid generation software. For example, gridder 315 pre-processes data from the database to grid the reservoir and partitions the grid for processing using, e.g., a METIS software application for partitioning grids produced by George Karypis at the University of Minnesota. The application servers 304 process the reservoir simulation using the grid, the output of which can then be interpreted by post-processing server 308. Specifically, post-processing server 308 accesses simulator results, including map output, well output and performance output, which may be stored on the file server 306, and generates user-friendly data displays. For example, post-processing server may have software loaded thereon that provides 3D visualization of the reservoir, well plots within the reservoir, and generates an analysis of the simulation results as compared with historical simulations. As one skilled in the art will appreciate, though depicted as separate servers for simplicity, pre-preprocessing server and post-processing server may be configured as the same server or cluster of servers. Finally, workstations 310 can access the post-processing server 308, or file server 306 to, e.g., modify, specify, control, upload, download or direct any output software. As one skilled in the art will appreciate, the embodiment discussed above has well history software, grid data software, map output software, and performance output software stored on the pre-processing server 302, but these may be stored on more than server or computer.

Figure 5A:
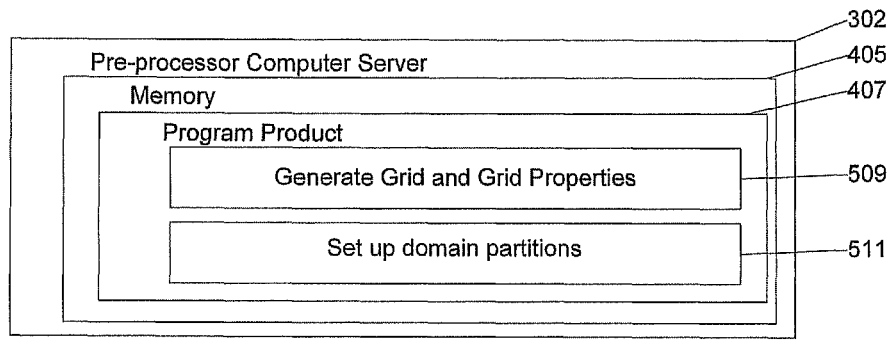
FIG. 5A is a diagram of a pre-processor computer having a memory and a program product of an embodiment of the instant invention installed thereon.

FIG. 5A describes the structure of the pre-processing server 302 in detail. The pre-processing server 302 comprises a memory 405, a program product 407, a processor, and an input/output device ("I/O device") (not shown). The I/O device connects the pre-processing server 302, via the network, to file server 306, application servers 304 and distributed computers 308, and can be any I/O device 408 including, but not limited to a network card/controller connected by a PCI bus to the motherboard, or hardware built into the motherboard to connect the pre-processing server 302 to the network 314. The I/O device s connected to the processor (not shown). The processor is the "brains" of the pre-processing server 302, and as such executes program product 407 and works in conjunction with the I/O device to direct data to memory 405 and to send data from memory 405 to the network. In this way, the processor may also make available the program product 407 to the application servers 304 and workstations 310. The processor can be any commercially available processor, or plurality of processors, adapted for use in an pre-processing server 302, e.g., Intel® Xeon® multicore processors, Intel® micro-architecture Nehalem, AMD Opteron™ multicore processors, etc. As one skilled in the art will appreciate, the processor may also include components that allow the pre-processing server 302 to be connected to a display [not shown] and keyboard that would allow a user direct access to the processor and memory 405. Memory 405 may store several pre and post processing software applications and the well history and grid data related to the methods described herein. As such, memory 405 may consists of both non-volatile memory, e.g., hard disks, flash memory, optical disks, and the like, and volatile memory, e.g., SRAM, DRAM, SDRAM, etc., as required to process embodiments of the instant invention. As one skilled in the art will appreciate, though memory 405 is depicted on, e.g., the motherboard, of the pre-processing server 302, memory 405 may also be a separate component or device, e.g., FLASH memory, connected to the pre-processing server 405. Memory 405 may also store applications that the workstations 310 can access and run on the pre-processing server 302.

Importantly, as is known in grid computing, the pre-processing server 302 creates the unstructured grids and grid partitions and computes cell properties for storage on the file server 306, so that the grids are accessible to the application servers 304 for processing. As one skilled in the art will appreciate, each application server accessing the file server 306 is only allowed to read data regarding one sub-domain, and that sub-domain's adjacent cells. Moreover, as one skilled in the art will recognize, the pre-processing server 302, shown as having multiple applications stored thereon, may only access data stored on the file server to compute grid data to save on pre-processing server memory and processing speeds.

Each pre-processing server 302 may communicate with the file server 306, and file server 306 may communicate with application servers 304 using, e.g., a communications software such as MPI interfacing. As known in the art, MPI interfacing comes with a plurality of library functions that include, but are not limited to, send/receive operations, choosing between a Cartesian or graph-like logical data processing 304 or a unstructured topology, combining partial results of computations, synchronizing application servers for data exchange between sub-domains, as well as obtaining network-related information such as the number of processes in the computing session, current processor identity that a application server 304 is mapped to, neighboring processes accessible in a logical topology, etc. Importantly, as is known in the art, the MPI interfacing software can operate with a plurality of software languages, including C, C++, FORTRAN, etc., allowing program product 326 to be programmed or interfaced with a plurality of computer software program products programmed in different computer languages for greater scalability and functionality, e.g., an implementation where pre-processing server 302 is implemented as a plurality of servers running separate programs for pre-processing algorithms.

Figure 4A:
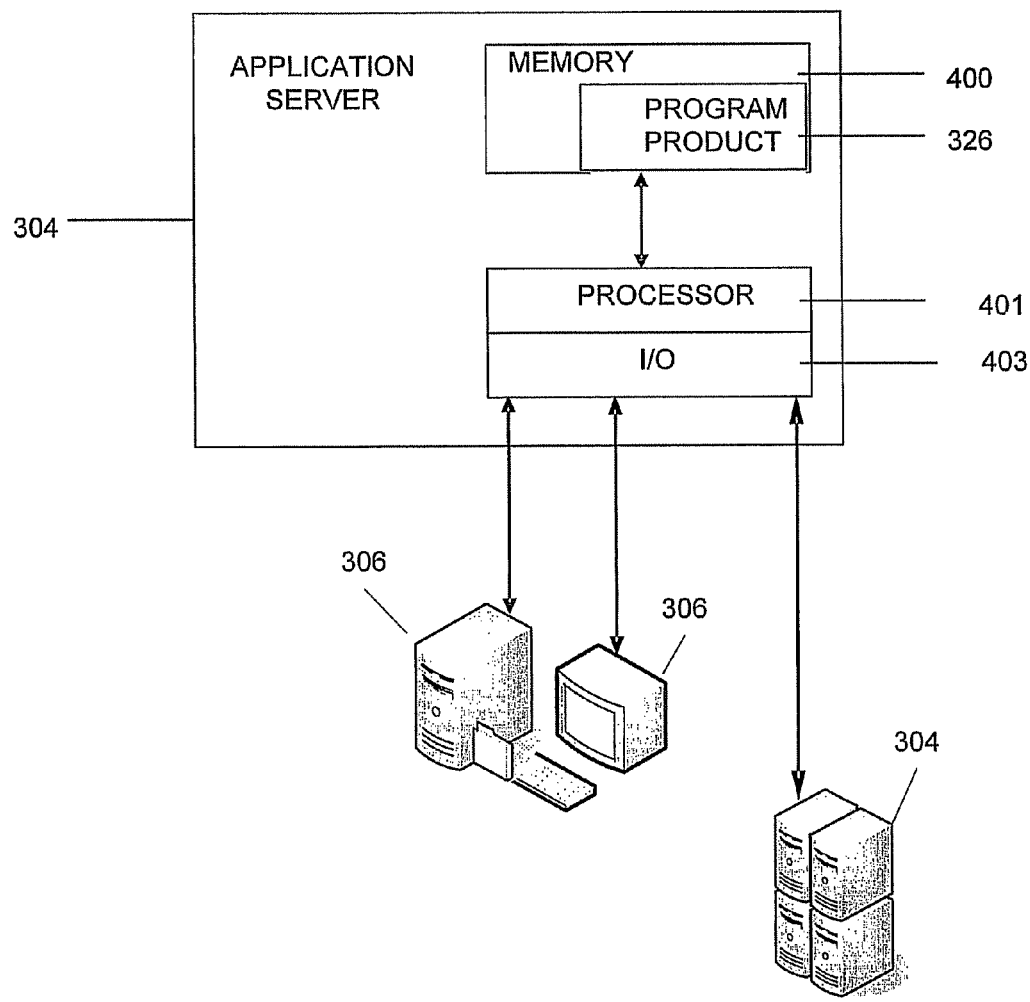
FIG. 4A is a block diagram of an application server used in the distributed network according to an embodiment of the invention.
Figure 4B:
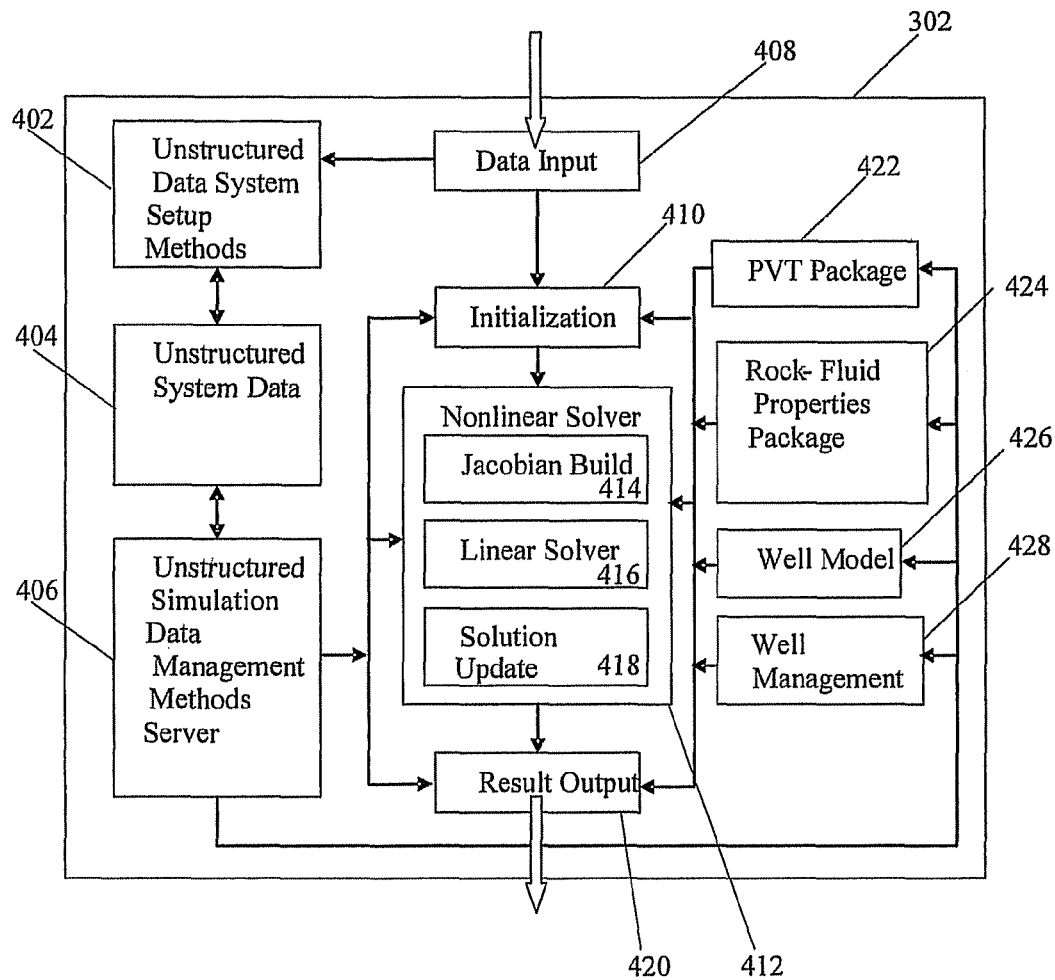
FIG. 4B is a diagram an application server showing various components operable thereon and used in the distributed network according to an embodiment of the invention.
Figure 5B:
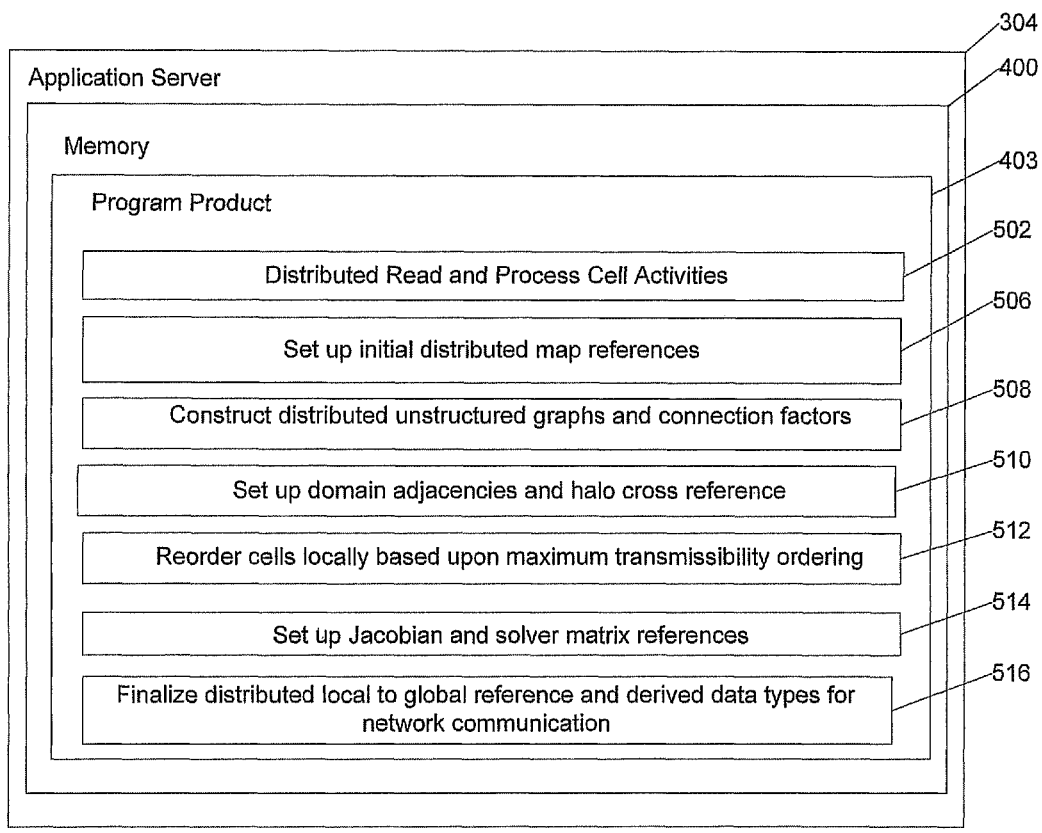
FIG. 5B is a diagram of an application server having a memory and a program product of an embodiment of the instant invention installed thereon.

FIGS. 4A, 4B, and 5B describe the structure of the application servers 304 in detail, which are linked together using a high-speed intranet TCP/IP connection. Like the pre-processing server 302, each application server 304 comprises a memory 400, a program product 326, a processor 401, and an input output device ("I/O") 403. I/O device 403 connects the application server 304, via the network, to file server 308, other application servers 304 and the pre-processing server 302, and can be any I/O device 403 including, but not limited to a network card/controller connected by a PCI bus to the motherboard, or hardware built into the motherboard to connect the application server 304 to the network (not shown). As can be seen, the I/O device 403 is connected to the processor 401. Processor 401 is the "brains" of the application server 304, and as such executes program product 404 and works in conjunction with the I/O device 403 to direct data to memory 400 and to send data from memory 400 to the network. Processor 401 can be any commercially available processor, or plurality of processors, adapted for use in an application server, e.g., Intel® Xeon® multicore processors, Intel® micro-architecture Nehalem, AMD Opteron" multicore processors, etc. As one skilled in the art will appreciate, processor 401 may also include components that allow the application servers 304 to be connected to a display [not shown] and keyboard that would allow a user to directly access the processor 401 and memory 400—though such configurations of the application servers 304 could slow the processing speeds of the computing cluster.

Memory 400 stores instructions for execution on the processor 401, including the operating system and communications software and consists of both non-volatile memory, e.g., hard disks, flash memory, optical disks, and the like, and volatile memory, e.g., SRAM, DRAM, SDRAM, etc., as required to application server 304 embodiments of the instant invention. As one skilled in the art will appreciate, though memory 400 is depicted on, e.g., the motherboard, of the application server 304, memory 400 may also be a separate component or device, e.g., FLASH memory, connected to the application servers 304. Importantly, memory 400 stores the program product of the instant invention. As shown, the program product 402 is downloaded into each application server 304 for performing the inventive methods, but one skilled in the art will appreciate that program product 326 may also be stored on a separate application server or the pre-processing server 302 for access by each of the networked application servers 304 though such a configuration could only be used for smaller simulations.

As one skilled in the art will appreciate, each application server 304 communicates with each other application server 304 using the I/O device 403 and a communications software, e.g. MPI interfacing. As known in the art, MPI interfacing comes with a plurality of library functions that include, but are not limited to, send/receive operations, choosing between a Cartesian or graph-like logical application server 304 or an unstructured topology, combining partial results of computations, synchronizing application servers for data exchange between sub-domains, as well as obtaining network-related information such as the number of processes in the computing session, current processor identity that a application server 304 is mapped to, neighboring processes accessible in a logical topology, etc. Importantly, as is known in the art, the MPI interfacing software can operate with a plurality of software languages, including C, C++, FORTRAN, etc., allowing program product 326 to be programmed or interfaced with a plurality of computer software program products programmed in different computer languages for greater scalability and functionality, e.g., an implementation where pre-processing server 302 is implemented as a plurality of servers running separate programs for pre-processing algorithms.

Program products 326 perform the methods of the invention and may be the same program product stored on one server and operable on the pre-processing server 302 and application servers 304, stored on pre-processing server 302 and operable on the application server 304 or various steps of the inventive method could be stored in the memory of the application servers 304 and pre-processing server 302 as applicable for the function of each. Accordingly, though the steps of the inventive methods and programming products may be discussed as being on each application server, one skilled in the art will appreciate; each of the steps can be stored and operable on any of the processors described herein, including any equivalents thereof.

Program product 326 may be part of the reservoir simulator GigaPOWERS™ The relationship of program product 326 to other software components GigaPOWERS™ is illustrated in FIG. 3B. Unstructured system data 404 contains various reference maps and hash tables which are created and organized by implemented methods 402. These reference maps and hash tables data 404, together with implemented methods in 406 provide the organized data access for read/write in the random access memory (RAM) of each application server 304 and achieve data communication/synchronization requirement with other processes running on other compute nodes 304 where each the application server 304 hold a sub-domain of grid cells of the global flow simulation problem. Software methods 406 and data system 404 serves all other software components in GigaPOWERS™ by managing the inter-relationship between sub-domains among compute nodes 304 and the inter-relationships between grid cells within each sub-domain in order to achieve reservoir simulation.

Parallel data input may be performed by each application server, and software process 408 places the data in the RAM of each application server 304. Software process 402 sets up the unstructured data 404, which is also placed in RAM, so that it is available to support all data access functionality of all other software components of the application server. The components includes the initialization module 410, the non-linear solver 412, the Jacobian builder 414, the linear solver 416, the solution update module 418, the PVT package 422, the rock-fluid property package 424, the well model 423, the well management module 428, the parallel output module 420, each of which will be described in detail herein below. As one skilled in the art will appreciate, the efficiency and parallel scalability of the simulator will depend on the data system and methods of 402/404/406 because they control and manage the data access, communication, computation of the application servers implementing a simulator such as GigaPOWERS™.

The program product 404 of the instant invention is stored in memory 400 and operable on processor 401, as shown in FIG. 5B. The program product 404 performs the steps of: reading activity data from the file server 308 into the application servers (502); partitioning the unstructured grids into domains (504); setting up initial distributed unstructured map reference (506); constructing distributed unstructured graphs and connection factors (508); setting up domain adjacencies and halo cross reference (510); reordering cells locally based upon maximum transmissibility ordering (512); setting up distributed Jacobian and solver matrix references (514); and finalizing distributed local to global reference and derived data types for network communication (516). Steps 502, 504, 506, 508, 510, 512, 514, and 516 are operable on the application servers 304 and perform internal reordering to minimize processing time and provide optimized sharing of halo data to adjacent sub-domains. In other words, in the exemplary embodiment, the pre-processing server 302 sets up the grid data for the application servers 304 to provide parallel processing of the well simulation.

As discussed above, the reservoir simulation typically involves the modeling of complex reservoir and well geometry and starts with the mapping or "gridding" of the reservoir using grid techniques that may be structured or unstructured, e.g., by preprocessing server 302. Though the methods of the invention may be employed with both structured and unstructured grids, as well as simulations of different model sizes, to describe the steps performed by the program product of the instant invention, a 2-dimensional unstructured grid will be used as an example. To model the reservoir using the unstructured grid, oil or gas reservoirs are subdivided into elementary finite-volumes, which are known as grid cells or grid blocks. These grid cells can have variable numbers of faces and edges that are positioned to honor physical boundaries of geological structures and well geometry embedded within the reservoir.

Figure 5C:
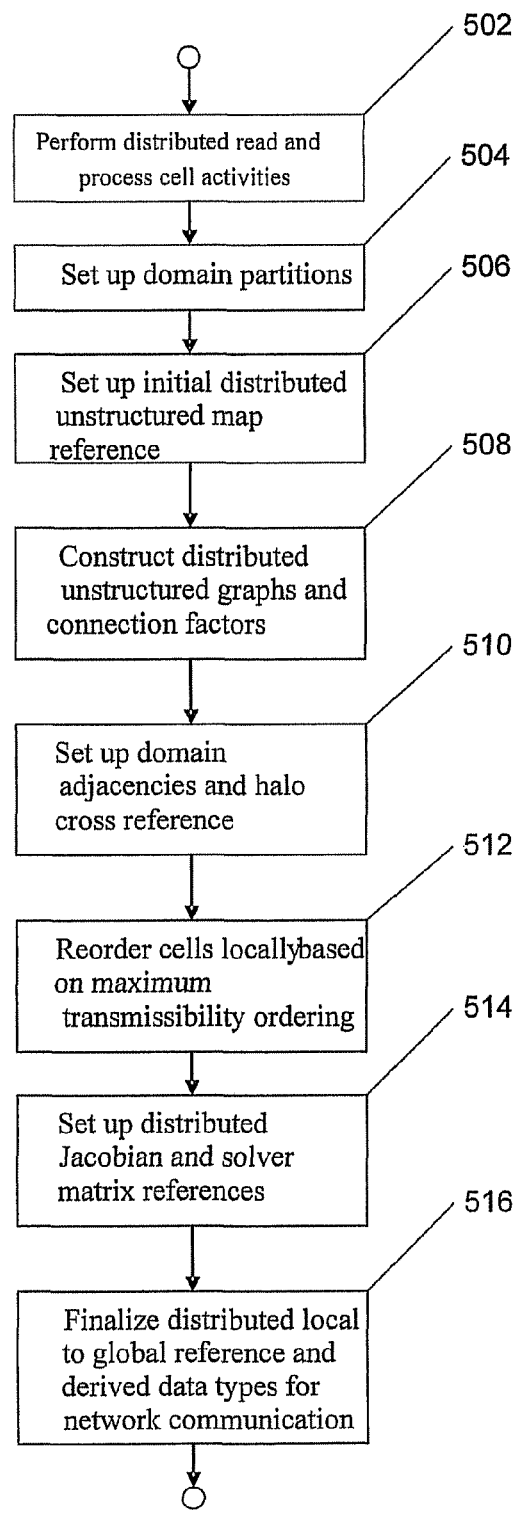
FIG. 5C is a system flow diagram of the operation of a computer program operable on the pre-processing server and application server of an embodiment of the invention of FIG. 5A.

All methods in FIGS. 5B and 5C are parallel methods. Once software 304 has been initiated to execute on a processor of one application server 304, that application server 304 may spawn exactly the number of parallel processes as designated by the user to run the simulation. Thereafter, each processor of each application server 304 may execute a copy of the software code 326 which handle the computation for a sub-domain of the overall problem. As shown, in step 502, cell activity is calculated in parallel from geometry and property data 326/328 read from the file server 306 into each application server 304 using, e.g., a distributed parallel read procedure employing the (MPI-2) interfacing discussed above. In step 502, prior to partitioning, inactive cells are removed by the pre-processing server 302. As one skilled in the art will recognize, a grid cell is inactive if it is a pinch-out, has porosity less than minimum porosity, pore volume less than minimum pore volume, or all permeabilities less than minimum permeability, as defined by the simulations parameters, e.g., those set by the reservoir engineers running the simulation. For computational efficiency, inactive cells are discounted from the local domain partitioning process as well as subsequent flow computation.

Figure 7:
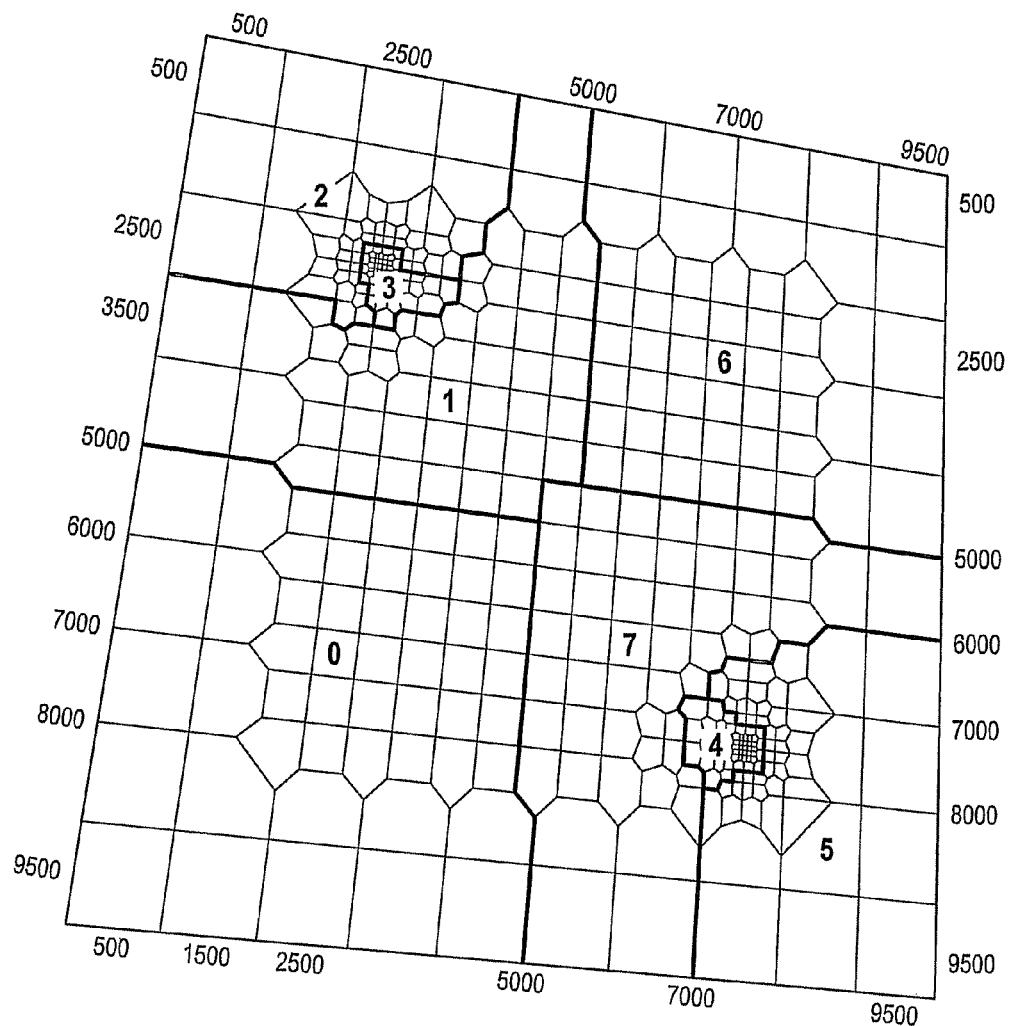
FIG. 7 is a diagram showing the unstructured grid divided into sub-domains according to an embodiment of the invention.

Utilizing the cell activity data to discount inactive cells, program product 326, which may be running on the first application server 304, may perform distributed parallel operations to generate optimal domain partitions, or sub-domains, of the plurality of remaining cells using, e.g., a METIS/PARMETIS software library (step 504). As is known in the art, the METIS/PARMETIS software library divides the grid into sub-domains of roughly equal number of cells and minimizes boundary regions. In this way, the application servers 304 may partition the grid instead of the preprocessing server 302 (or the pre-processing server 302 may also be another application server 304). One sub domain may be assigned to each application server 304 within a cluster of application servers 304 to solve the reservoir simulation problem, i.e., to compute the simulation for the plurality of cells in the sub-domain. Each sub-domain, for example, has roughly equal number of active cells, identified using, for example, a global cell ID (shown in FIG. 9), and the sub-domain bounding surface is minimized to reduce network communication requirement. An exemplary partitioning of sub-domains is shown with reference to FIG. 7. As can be seen, each sub-domain 0-7 is adjacent to at least one other sub-domain.

Figure 9:
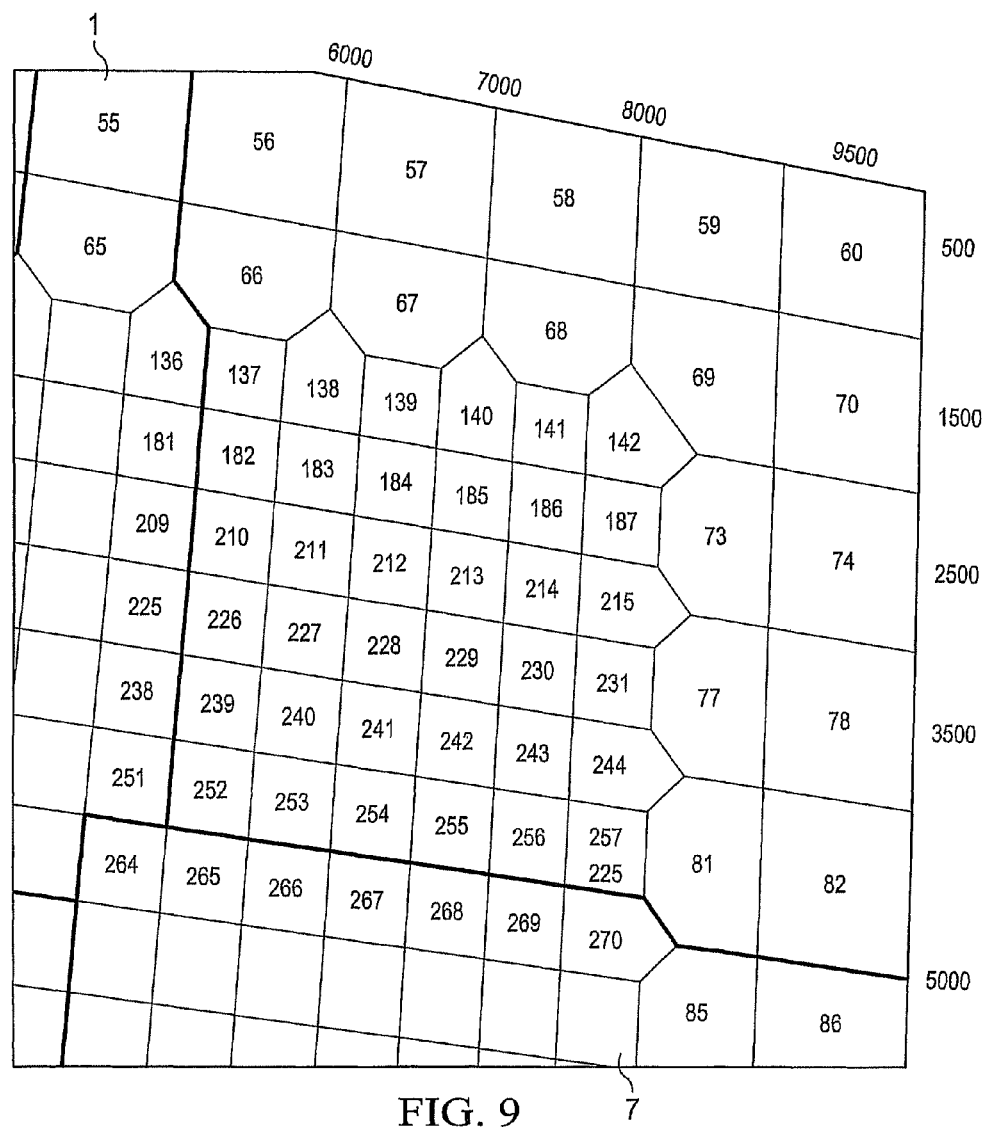
FIG. 9 is a diagram of a sub-domain showing an exemplary global cell numbering for the grid cells according to an embodiment of the invention.
Figure 10:
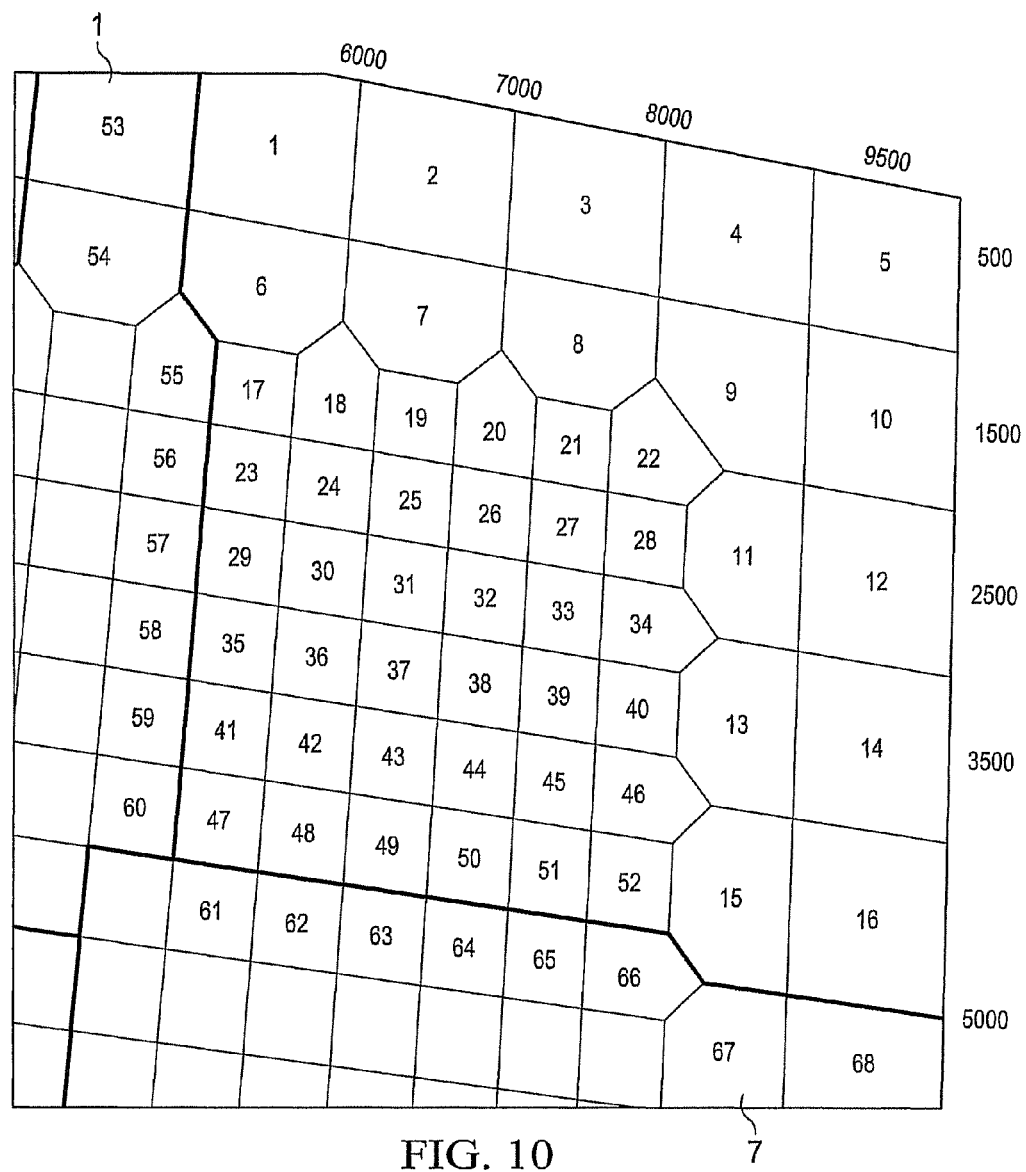
FIG. 10 is a diagram of a sub-domain showing a first permutation of grid cell ordering according to the location of the grid cell inside the sub-domain or inside an outer halo regions.

In step 506, based on the domain partitions generated in step 504, an initial distributed cell reference map is computed for the cells in each sub-domain to refer to the global cell ID generated above, as shown, for example, in FIG. 10. As can be seen, the global cell IDs shown in FIG. 9, are indexed completely locally in FIG. 10. This initial ordering of local cell IDs is known as the first permutation.

Figure 6:
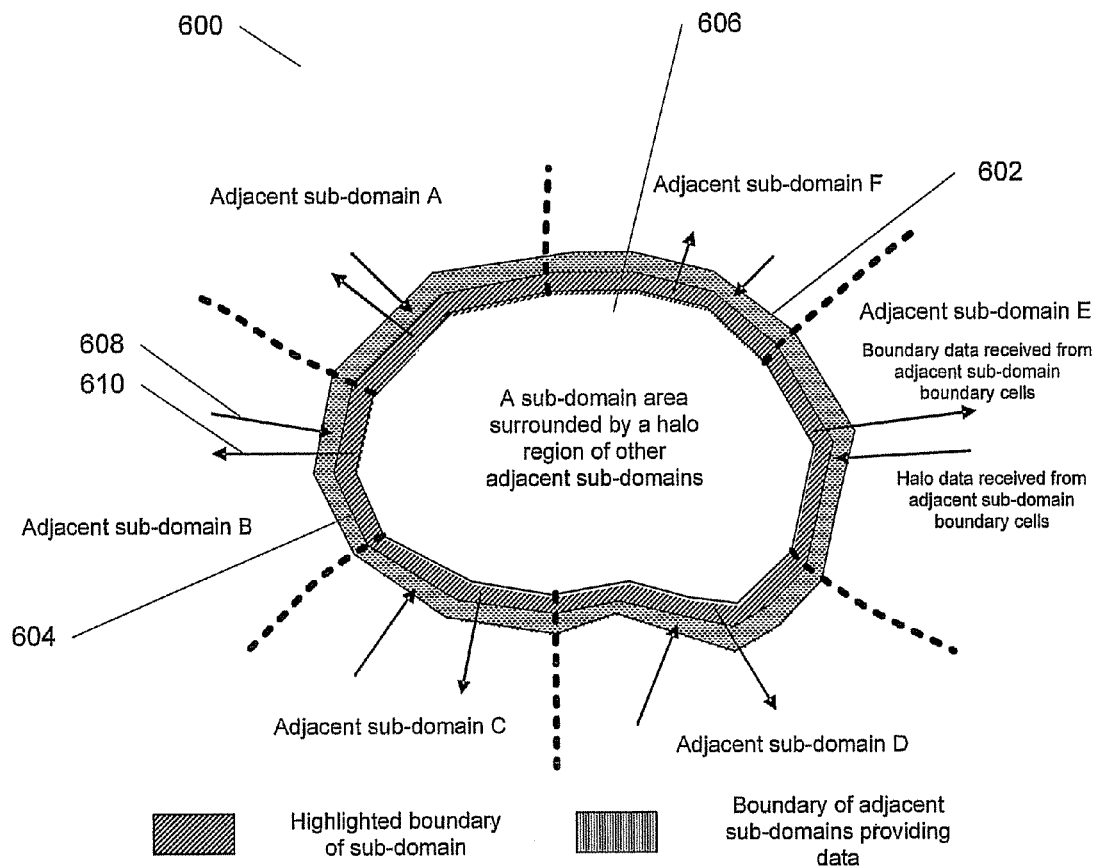
FIG. 6 is a diagram showing a sub-domain and its neighbors according to an embodiment of the invention.
Figure 8:
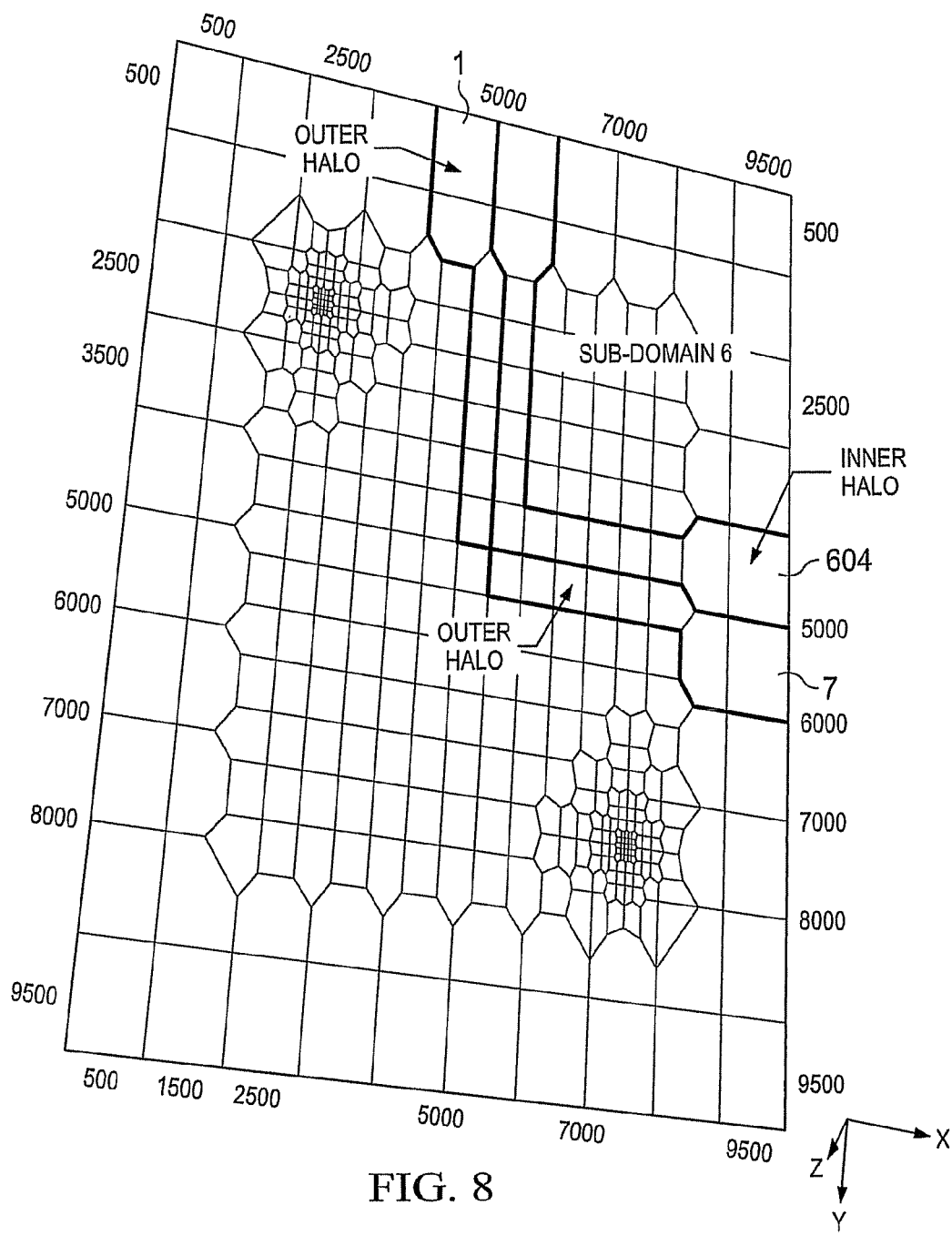
FIG. 8 is a diagram of a sub-domain showing the sub-domain's interior region, inner halo region and outer halo region according to an embodiment of the invention.

The local cell ID to global cell ID references from step 506 is used to perform a distributed parallel reading of the grid data, input parameters, e.g., from workstations, and well history data, including porosity and permeability data, from the file server 306 into the local memory of each application server 304 and to construct graphs using the same in step 508. This data includes the data that describe the geometry for each grid cell, i.e., where the grid cell is located with respect to other grid cells in the simulator. As shown in FIGS. 6 and 8, each sub-domain is at least partially surrounded with a plurality of boundary cells, assigned to adjacent sub-domains, known as the halo region 602. The halo region 602 contains cells from adjacent sub-domains that share at least one cell facet with sub-domain cells 604 which reside on the external boundary of the sub-domain (outer halo), and cells in the sub-domain that share a facet with a neighboring sub-domain (inner halo). In this step, each application server 304 constructs the distributed unstructured graph to describe the connectivities of all the cells in its sub-domain and the halo, for example, as shown in FIG. 11. At the same time, the connection factors (also known as transmissibility) between two adjacent cells can be calculated. Each compute process running program product 326 on application server 304 generates its own portion of the connectivity graphs and stores it in, for example, the distributed compressed sparse row (CSR) format. Moreover, each connection can further be identified as either in-domain connection or out-of-domain connection. An out-of-domain connection is one between an in-domain grid-cell and a halo grid-cell. Active halo cells, which have no transmissibilities with the internal sub-domain cells, are discounted in this step to minimize necessary inter-application server 304 communication.

Figure 14:
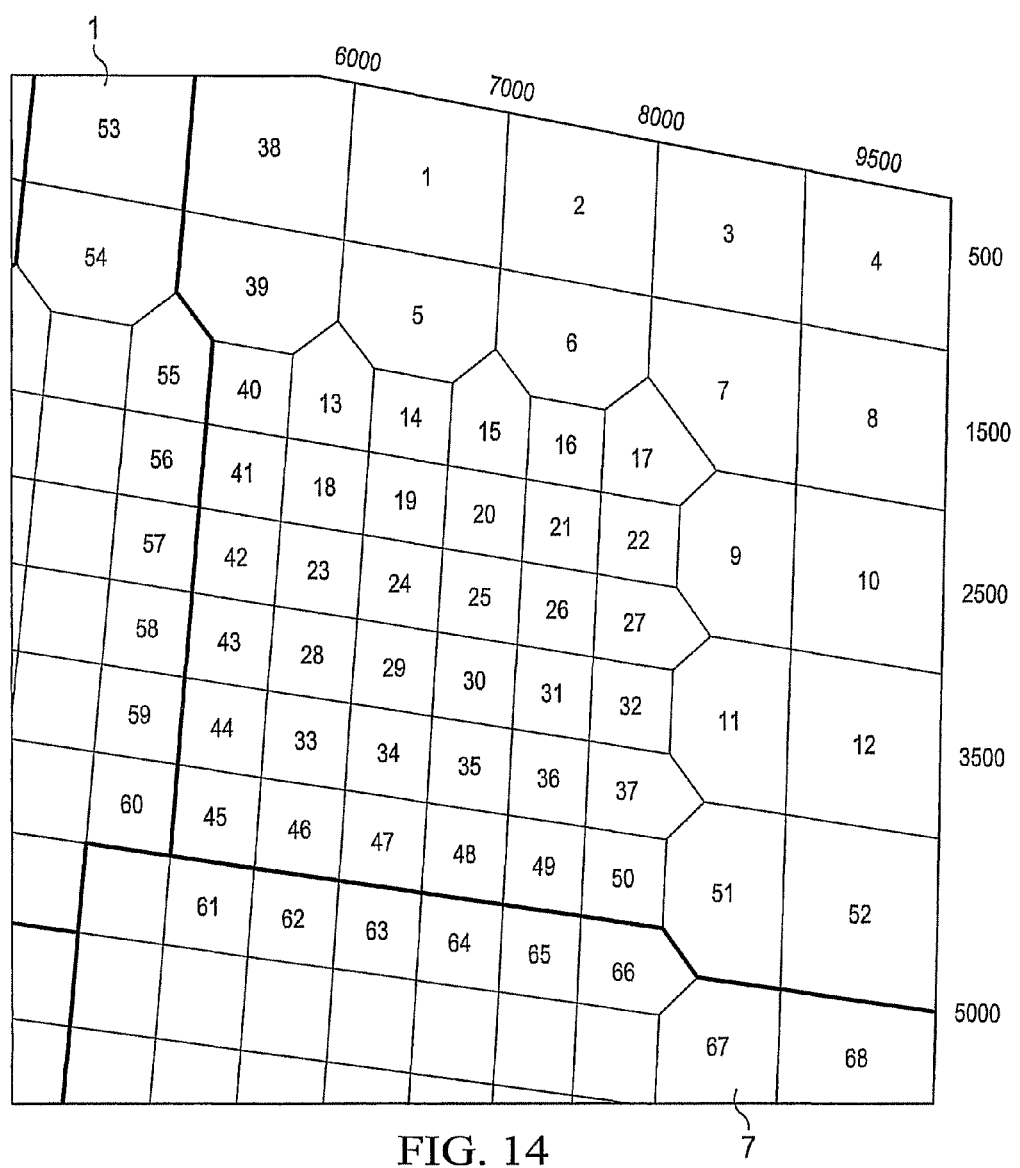
FIG. 14 is a diagram of a sub-domain showing a second permutation of cell ordering in the local numbering of grid cells according to the location of the grid cells in an interior region of sub-domain, inner halo region of the sub-domain, or outer halo regions of the sub-domains according to an embodiment of the invention.

In step 510, utilizing the computed graph and its associated data in step 508, sub-domain adjacency is computed. Sub-domain adjacency is the distributed graph, which identifies for each sub-domain all of its neighboring sub-domains, like the one shown in FIG. 12. The distributed sub-domain connectivity graph is also stored in, for example, CSR format but in distributed parallel fashion. The in-domain cells that reside on the sub-domain boundary are identified and the adjacent sub-domain IDs that share these cells facets are identified. The sub-domain adjacency information is used to form a second permutation for the local cell IDs such that all interior cells are ordered first and boundary cells are ordered next in sequence of blocks based on sub-domain adjacency, e.g., as shown in FIG. 14. As can be seen, the exemplary second permutation of local grid cells orders the sub-domain interior cells first, the inner halo region cells next, and the outer halo region last.

The second permutation of local boundary cell IDs are also exchanged among the adjacent application servers 304 so that each application server 304 has the necessary information to exchange boundary cell data during transient time stepping of flow simulation (shown in FIG. 13). The incoming data from adjacent sub-domain boundaries are placed in the halo regions, e.g., in cached memory, so that the process server can place the incoming data in the outer halo region.

Figure 15:
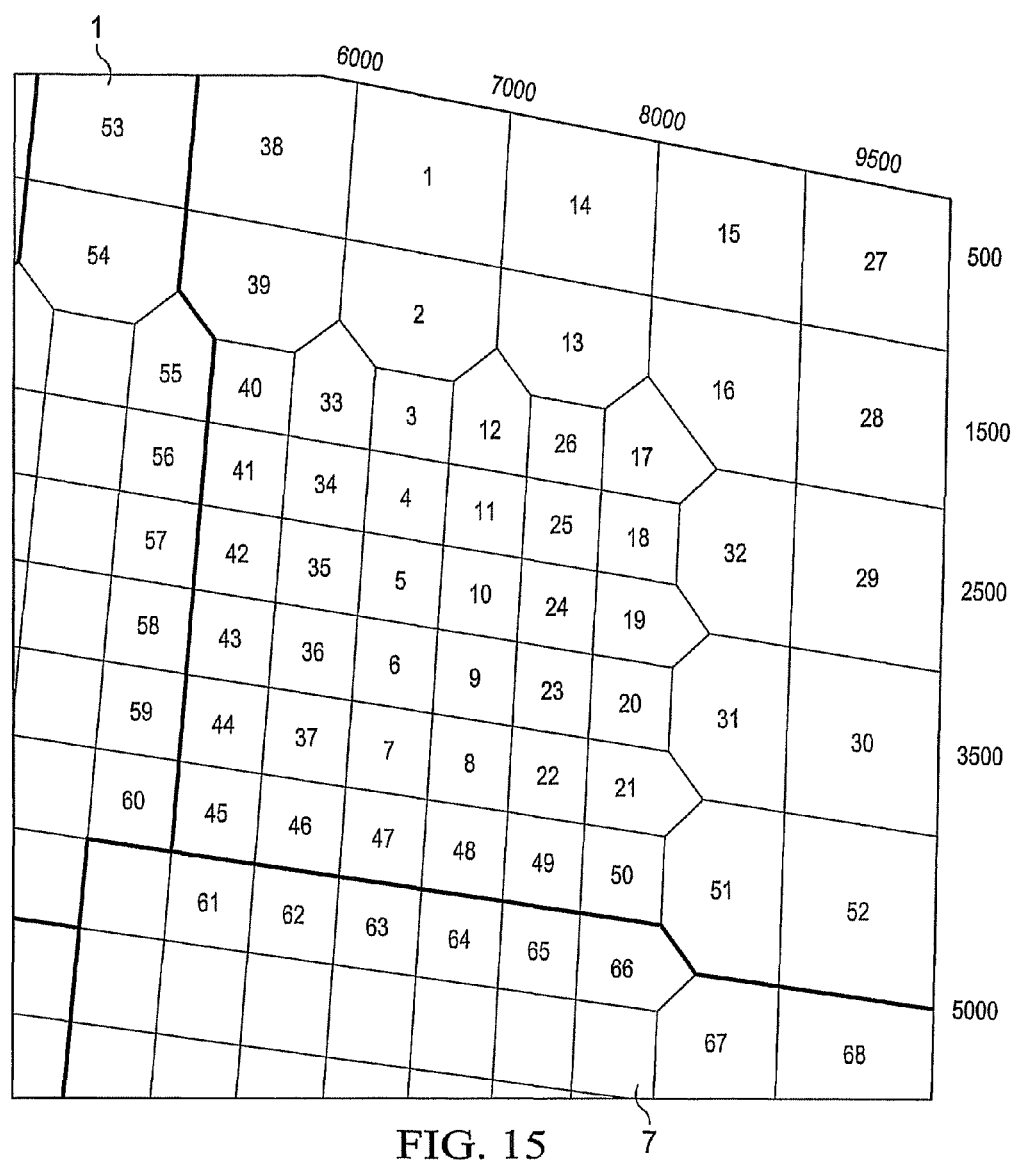
FIG. 15 is a diagram of the sub-domain 6 showing the third permutation of cell ordering in the local numbering of grid cells according to the transmissibility of the cells according to an embodiment of the invention.

In step 512, after the domain-partitioning step 510, the order of cells may not be optimal for the simulation algorithms and a better cell ordering may be required for computational efficiency. For example, maximum transmissibility ordering (MTO) of the local cells may be performed to further reduce process time. For such embodiments, and the preferred embodiment of the invention, MTO sequences the cell list by following the largest transmissibility pathways through the graph constructed in step 508. However, other reordering methods such as the reverse Cuthill-McKee (RCM) ordering or fill-reducing ordering can be implemented using the inventive method and are included within the scope of the disclosure. As one skilled in the art will appreciate, the reordering step produces a third permutation of local cell ID for the system such that the cell ordering is optimal for the numerical solution application server 304 during flow simulation, as shown in FIG. 15.

Utilizing results from step 508, 510, and 512, the indexing systems for the distributed graphs representing the Jacobian matrix and the solver matrices for each sub-domain can be built in step 514. These distributed graphs consist of two CSR lists: one for the in-domain connections and one for the out-of-domain connections, in order to facilitate the overlapping of communication and computation to enhance parallel scalability. In other words, each application server can process data between in-domain cells and communicate with other application servers simulations. The distributed graphs for the Jacobian is bidirectional, so data can flow between application servers 302, and the Jacobian matrix has a symmetric non-zeros structure but asymmetric in values. The referencing of symmetric positions in the matrices is useful during Jacobian construction and the symmetrical references are computed and stored in this step. The distributed transmissibility graph is also reordered from the initial cell ID permutation in step 606 to the final cell ID permutation in step 612, as shown in FIGS. 16 and 17.

Finally, distributed derived data types for inter-application server 304 communication among adjacent application servers in order to run the simulation is generated, step 616. Essentially, this is a sub-domain's local ID to another sub-domain's local ID referencing system. Methods to perform both synchronous and asynchronous inter-application server communication utilizing the derived data types are constructed and used to communicate halo variables and data during the reservoir simulation.

As one skilled in the art will recognize, the methods of the system are scalable for simulation size and well type. For example, another reference system may be constructed for well completions in the distributed unstructured grid cells belonging to the sub-domains. A single well network can have multiple laterals and can span two or more sub-domains. The disclosed indexing system may be used in parallel gather/scatter methods to construct well constraint equations from the required data residing in the distributed variable maps of grid cells and to construct the well source and sink terms of the individual component mass or energy balance equations for the perforated grid cells. The reading of well perforation data uses the inverse cell reference method of the system to locate local cell ID and application server 304 from the global cell ID of the perforation. The local cell ID to global cell ID indexing can be finalized based on the final local permutation. Such an indexing system forms the necessary data to perform parallel distributed input/output of processing of simulation data and results through the MP1-2 standard protocol.

As one skilled in the art will appreciate, a small 2D unstructured-grid model is used to illustrate the system and methods of the invention, which considers the case when the model is assigned to eight application servers to run the simulation and sub-domain 6 is chosen to illustrate the cell identification and ordering steps of the inventive method, but this exemplary embodiment is in no way limiting of the disclosure. Simulations using unstructured and structured grids of various types and sizes may be processed using the inventive machine, program product, and computer-implemented methods of the disclosure. Moreover, in exemplary embodiment, all the grid-cells are active. However, when inactive cells exist in the model, they may be discounted from the maps and graphs during steps 502 and 504 for memory management. Such discounting usually results in a modest to a significant saving of RAM space. It should also be noted that an active cell in the outer-halo might be discounted if it is connected to an inactive cell in its sub-domain.

As one skilled in the art will appreciate, for each application server 304, the data files for a model are independent of the number of application servers used to solve a particular simulation model. Each grid cell in the model has a cell ID so that all the properties for that grid cell can be referenced. During parallel computer simulation, the memory of an application server 304 holds only the data for the sub-domain assigned to it. This is known as distributed data store. A reference system such that the global cell ID of the model can be determined given any local cell ID on any application server 304.

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification.

The invention claimed is:

1. A machine for simulating a production characteristic for a plurality of oil or gas wells defined by a grid of a reservoir, the machine comprising:

a first application server having a processor and a non-transitory memory, the memory having computer readable instructions stored thereon and operable on the processor, the first application server performing a process of dividing the grid into a plurality of sub-domains, and a process of assigning each of a plurality of cells of the plurality of sub-domains an index; the computer readable instructions comprising:

creating the plurality of cells from geologic characteristics of a subsurface, the plurality of cells having faces that are formed equidistant to each of a plurality of points corresponding to the geologic characteristics, discounting any cells of the plurality of cells that are not active, and dividing the remaining cells of the plurality of cells into a plurality of sub-domains, and assigning each one of the remaining cells of the plurality of cells an original index;

at least one separate application server having a processor and a memory with computer readable instructions stored thereon, the at least one application server being assigned the at least one sub-domain of the plurality of sub-domains and including a computer program product, operable on the memory, for performing a process of re-ordering a local cell identification reference for each of the plurality of cells in the at least one sub-domain using characteristics of each cell and a cell location within the at least one sub-domain and a process of simulating at least one production characteristic of the reservoir; the computer readable instructions comprising:

creating an initial local cell identification reference for each of the plurality of cells in the at least one sub-domain, each local cell identification reference being mapped to the original index for each of the plurality of cells, generating transmissibility characteristics between each of the plurality of cells in the at least one sub-domain using grid data, well data and permeability data read into the memory of the separate application server using the initial local cell identification reference, determining at least one other sub-domain adjacent to the at least one sub-domain, and which of the plurality of cells in the at least one sub-domain share at least one face with a second plurality of cells of the at least one other sub-domain, re-indexing each of the plurality of cells in the at least one sub-domain according to whether each cell shares at least one face with the second plurality of cells of the at least one other sub-domain, and re-indexing each of the plurality of cells in the at least one sub-domain according to the transmissibility of each cell of the plurality of cells, and transmitting simulation data between each cell of the plurality of cells in the at least one sub-domain sharing at least one face with the at least one other sub-domain.

2. A machine of claim 1, wherein the geological characteristics include at least one of depth, porosity, transmissibility, rock regions, rock properties and permeability.

3. A machine of claim 1, wherein the first application server and the separate application server are connected together on a secured network and form a computer cluster.

4. A machine of claim 1, wherein the first application server and the separate application server are connected together on a wide area network, so that the first application server, and the separate application server are located remotely from each other.

5. A machine of claim 2, wherein a file server stores the geological characteristics in separate fields for each one of the geological characteristics, and the application server accesses each of the fields to run simulation calculations, using said computer program product.

6. A machine of claim 1, further comprising a file server, the file server storing grid data, well data and permeability data and geological characteristics in a non-transitory memory thereon, the file server having a computer program product stored thereon that allows the first application server and the separate application server to access to the data using the database program product.

7. A machine of claim 6, wherein simulation results for each of the plurality of sub-domains are written in parallel and stored in the database in global tables based on global cell indices.

8. A computer program product, operable on a machine defining a computer and stored in a memory of the computer, the computer program product performing a process of dividing a grid defining a reservoir into a plurality of sub-domains and a plurality of cells, a process of reordering a local cell identification reference for each of the plurality of cells using characteristics of each cell of the plurality of cells and a cell location within at least one sub-domain of the plurality of sub-domains, and a process of simulating at least one production characteristic of the reservoir; the computer program product performing the steps of:

creating the plurality of cells from geologic characteristics of a subsurface, the plurality of cells having faces that are formed equidistant to each of a plurality of points corresponding to the geologic characteristics;

discounting any cells of the plurality of cells that are not active, and dividing the remaining cells of the plurality of cells into a plurality of sub-domains;

assigning each one of the plurality of cells an original index;

creating an initial local cell identification reference for each of the plurality of cells in the at least one sub-domain, each local cell identification reference being mapped to the original index for each of the plurality of cells;

generating transmissibility characteristics between each of the plurality of cells in the at least one sub-domain using grid data, well data and permeability data read into the memory of the separate application server using the initial local cell identification reference;

determining at least one other sub-domain adjacent to the at least one sub-domain, and which of the plurality of cells in the at least one sub-domain share at least one face with a second plurality of cells of the at least one other sub-domain;

re-indexing each of the plurality of cells in the at least one sub-domain according to whether each cell shares at least one face with the second plurality of cells of the at least one other sub-domain;

re-indexing each of the plurality of cells in the at least one sub-domain according to the transmissibility of each of the plurality of cells; and transmitting simulation data between each cell of the plurality of cells in the at least one sub-domain sharing at least one face with the at least one other sub-domain.

9. A computer program product of claim 8, wherein the geological characteristics include at least one of depth, porosity, transmissibility, rock regions, rock properties and permeability.

10. A computer program product of claim 8, wherein the program product is implemented on a first application server and the separate application server connected together to form a computer cluster.

11. A computer program product of claim 10, wherein the first application server and the separate application server are connected together on a wide area network, so that the first application server and the separate application server are located remotely from each other.

12. A computer program product of claim 10, wherein a file server stores the geological characteristics in separate fields for each one of the geological characteristics, and the application server accesses each of the fields to run simulation calculations, using said computer program product.

13. A computer program product of claim 10, further comprising a file server, the file server accessing and storing grid data, well data and permeability data and geological characteristics in a database thereon, the file server having a computer program product stored thereon that allows the first application server and the separate application server to access to the well characteristics or geological characteristics using the database program product.

14. A computer program product of claim 8, wherein simulation results for each of the plurality of sub-domains are written and stored in the database in a separate table for each of the plurality of sub-domains.

15. A computer-implemented method for performing a process of dividing a grid defining a reservoir into a plurality of sub-domains and a plurality of cells, a process of reordering a local cell identification reference for each of the plurality of cells using characteristics of each cell and a cell location within at least one sub-domain of the plurality of sub-domains and a process of simulating at least one production characteristic of the reservoir; the computer-implemented method performing the steps of:

creating the plurality of cells from geologic characteristics of a subsurface, the plurality of cells having faces that are formed equidistant to each of a plurality of points corresponding to the geologic characteristics;

discounting any cells of the plurality of cells that are not active, and dividing the remaining cells of the plurality of cells into a plurality of sub-domains;

assigning each one of the plurality of cells an original index;

creating an initial local cell identification reference for each of the plurality of cells in the at least one sub-domain, each local cell identification reference being mapped to the original index for each of the plurality of cells;

generating transmissibility characteristics between each of the plurality of cells in the at least one sub-domain using grid data, well data and permeability data read into the memory of the separate application server using the initial local cell identification reference;

determining at least one other sub-domain adjacent to the at least one sub-domain, and which of the plurality of cells share at least one face with a second plurality of cells of the at least one other sub-domain;

re-indexing each of the plurality of cells in the at least one sub-domain according to whether each cell in the at least one sub-domain shares at least one face with the second plurality of cells of the at least one other sub-domain;

re-indexing each of the plurality of cells in the at least one sub-domain according to the transmissibility of each of the plurality of cells; and transmitting simulation data between each cell of the plurality of cells in the at least one sub-domain sharing at least one face with the second plurality of cells of the at least one other sub-domain.

16. A computer-implemented method of claim 15, wherein the geological characteristics include at least one of depth, porosity, transmissibility, rock regions, rock properties and permeability.

17. A computer-implemented method of claim 15, wherein the program product is implemented on a first application server and the separate application server connected together to form a computer cluster.

18. A computer-implemented method of claim 17, wherein the first application server and the separate application server are connected together on a wide area network, so that the first application server, and the separate application server are located remotely from each other.

19. A computer-implemented method of claim 17, wherein a file server stores the geological characteristics in separate fields for each one of the geological characteristics, and the application server accesses each of the fields to run simulation calculations, using said computer program product.

20. A computer-implemented method of claim 17, further comprising a file server, the file server accessing and storing grid data, well data and permeability data and geological characteristics in a database thereon, the file server having a computer program product stored thereon that allows the first application server and the separate application server to access to the well characteristics or geological characteristics using the database program product.

* * * * *